United States Patent [19]

Cocke et al.

[11] 4,306,286
[45] Dec. 15, 1981

[54] LOGIC SIMULATION MACHINE

[75] Inventors: John Cocke, Bedford Village, N.Y.; Richard L. Malm, San Jose, Calif.; John J. Shedletsky, North Salem, N.Y.

[73] Assignee: International Business Machines Corporation, Armonk, N.Y.

[21] Appl. No.: 53,444

[22] Filed: Jun. 29, 1979

[51] Int. Cl.³ .............................................. G06F 15/16
[52] U.S. Cl. ................................................... 364/200
[58] Field of Search ................ 364/200 MS File, 400, 364/488, 489, 490, 491, 578, 900 MS File; 307/207; 328/92, 93, 94

[56] References Cited

U.S. PATENT DOCUMENTS

| 3,278,732 | 10/1966 | Haynes | 307/207 X |
|---|---|---|---|
| 3,308,285 | 3/1967 | Winder | 307/207 X |
| 3,381,117 | 8/1968 | Forslund et al. | 364/716 |
| 3,400,379 | 9/1968 | Harmon | 307/207 X |
| 3,458,240 | 7/1969 | Hanson | 307/207 X |
| 3,544,973 | 12/1970 | Borck, Jr. et al. | 364/200 |
| 3,614,745 | 10/1971 | Podvin | 364/200 |
| 3,634,830 | 1/1972 | Baskin | 364/200 |
| 3,701,976 | 10/1972 | Shively | 364/200 |
| 3,728,534 | 4/1973 | Bertram et al. | 307/207 X |
| 3,810,114 | 5/1974 | Yamada et al. | 364/200 |
| 3,823,321 | 7/1974 | Von Rauch | 250/442 |
| 3,902,050 | 8/1975 | Schmidt et al. | 307/207 X |
| 3,913,070 | 10/1975 | Malcolm et al. | 364/200 |
| 4,015,246 | 3/1977 | Hopkins, Jr. et al. | 364/200 |
| 4,035,777 | 7/1977 | Moreton | 364/200 |
| 4,050,058 | 9/1977 | Garlic | 364/200 |
| 4,053,947 | 10/1977 | Carlsson et al. | 364/200 |
| 4,057,845 | 11/1977 | Ejiri et al. | 364/200 |
| 4,065,808 | 12/1977 | Schomberg et al. | 364/200 |
| 4,067,058 | 1/1978 | Brandstaetter et al. | 364/200 |
| 4,079,455 | 3/1978 | Ozga | 364/200 |
| 4,084,224 | 4/1978 | Appell et al. | 364/200 |
| 4,087,794 | 5/1978 | Beausoleil et al. | 364/200 |
| 4,144,566 | 3/1979 | Timsit | 364/200 |

Primary Examiner—Harvey E. Springborn
Assistant Examiner—Thomas M. Heckler
Attorney, Agent, or Firm—John J. Goodwin

[57] ABSTRACT

A hardware logic simulation machine comprised of an array of specially designed parallel processors, with there being no theoretical limit to the number of processors which may be assembled into the array. Each processor executes a logic simulation function wherein the logic subnetwork simulated by each processor is implicitly described by a program loaded into each processor instruction memory. Logic values simulated by one processor are communicated to other processors by a switching mechanism controlled by a controller. If the array consists of i processor addresses, the switch is a full i-by-i way switch. Each processor is operated in parallel, and the major component of each processor is a first set of two memory banks for storing the simulated logic values associated with the output of each logic block. A second set of two memory banks are included in each processor for storing logic simulations from other processors to be combined with the logic simulation stored in the first set of memory banks.

6 Claims, 29 Drawing Figures

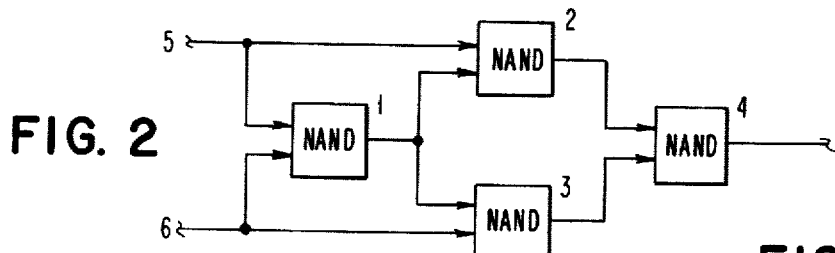
FIG. 2
FIG. 3
| ADDRESS | FUNCTION | ADR1 | ADR2 | ADR3 | ADR4 | ADR5 |
|---|---|---|---|---|---|---|
| 1 | NAND | 5 | 6 | | | |
| 2 | NAND | 5 | 1 | | | |
| 3 | NAND | 1 | 6 | | | |
| 4 | NAND | 2 | 3 | | | |
FIG. 4
| ADDRESS | MAJOR CYCLE | | | |
|---|---|---|---|---|
| | 1 | 2 | 3 | 4 |
| 1 | * | 1 | 1 | 1 |
| 2 | * | 1 | 1 | 1 |
| 3 | * | * | 0 | 0 |
| 4 | * | * | * | 1 |
| 5 | 0 | 0 | 0 | 0 |
| 6 | 1 | 1 | 1 | 1 |
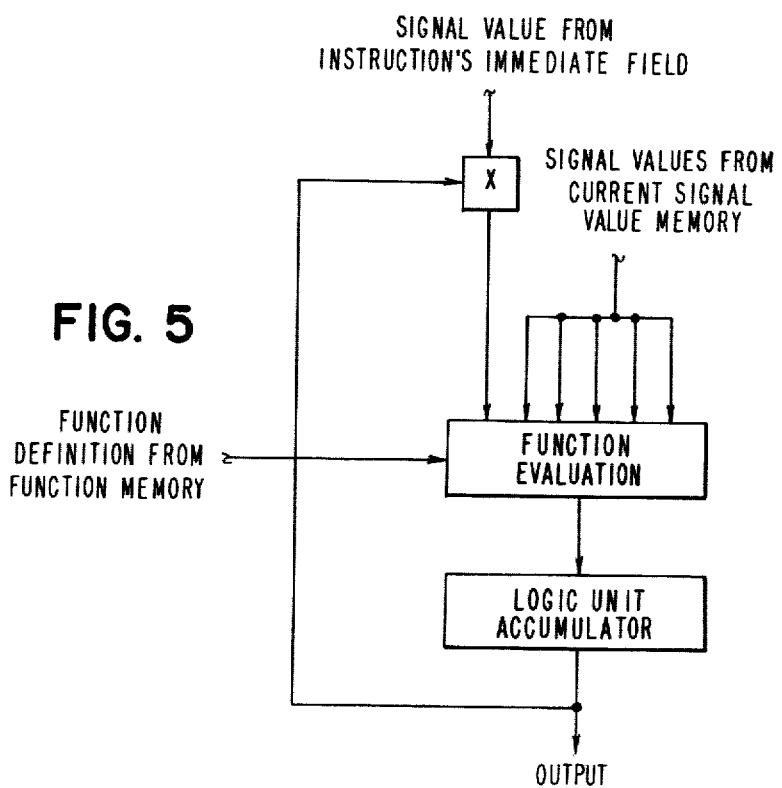
FIG. 5

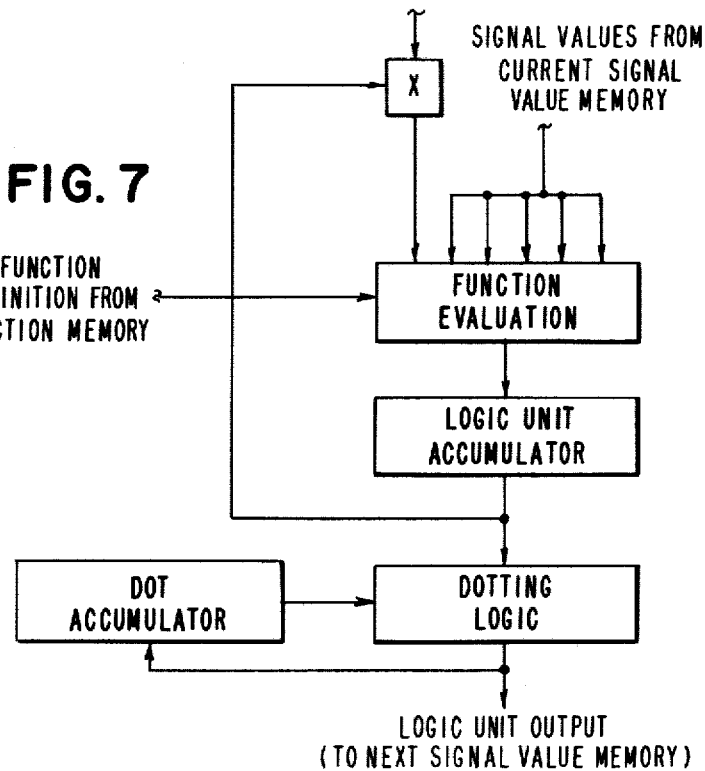
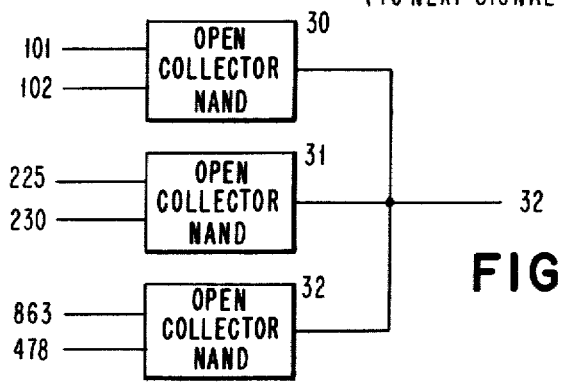

| ADDRESS | FUNCTION | SAVE FOR DOT | DOT SELECT | DOT FUNCTION | AD1 | AD2 | AD3 | AD4 | AD5 |
|---|---|---|---|---|---|---|---|---|---|
| 30 | NAND | 1 | 0 | X | 101 | 102 | | | |
| 31 | NAND | 1 | 1 | 0 | 225 | 230 | | | |
| 32 | NAND | 0 | 1 | 0 | 863 | 478 | | | |

| PROCESSOR 1 | | PROCESSOR 2 | | PROCESSOR 3 | |
|---|---|---|---|---|---|
| ADDRESS | PROCESSOR ADDRESS | ADDRESS | PROCESSOR ADDRESS | ADDRESS | PROCESSOR ADDRESS |
| 18 | 3 | 18 | 1 | 18 | 1 |
| | | | | ... | ... |
| | | | | 49 | 2 |

| ADDRESS | FUNCTION | ADDRESS SOURCE | AD1 | | AD2 | |
|---|---|---|---|---|---|---|
| 18 | F1 | 0 | 54 | 1 | 18 | PROCESSOR 1 |
| 49 | F2 | 1 | 18 | 0 | 31 | PROCESSOR 2 |
| 18 | F3 | 1 | 18 | 1 | 49 | PROCESSOR 3 |

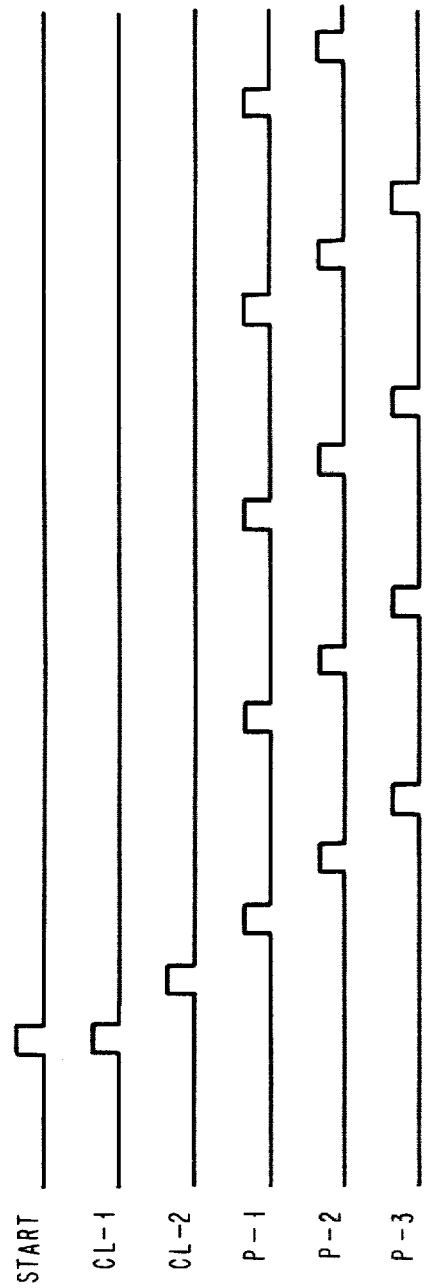

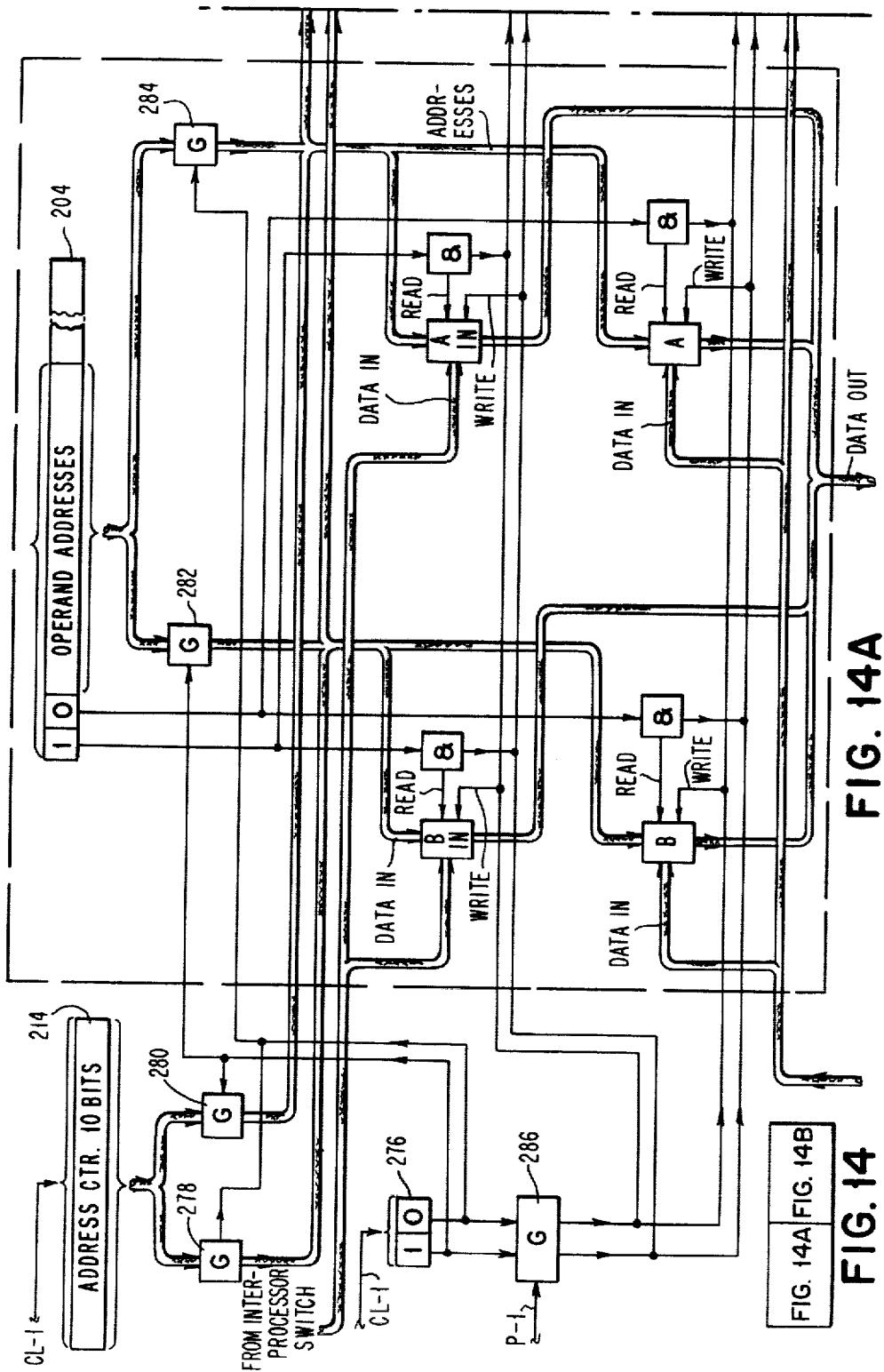

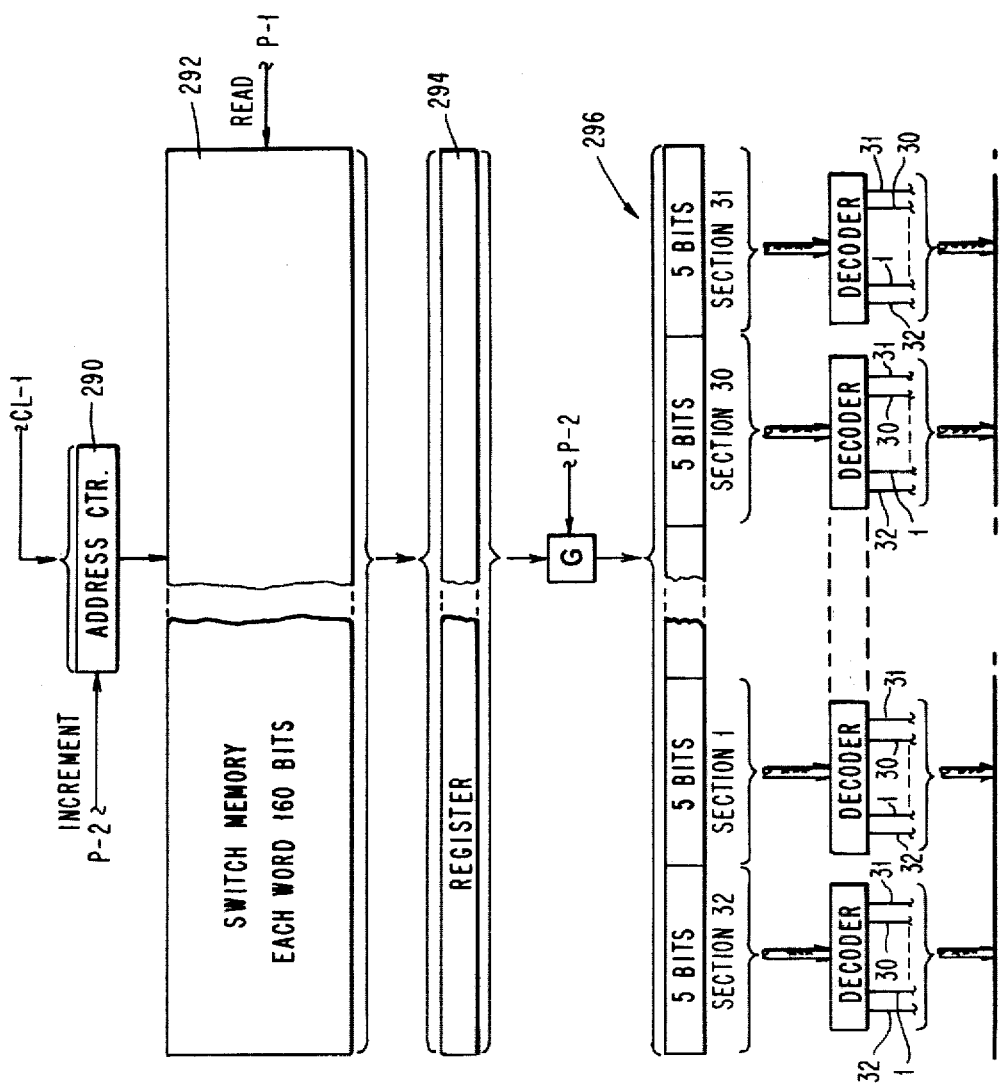

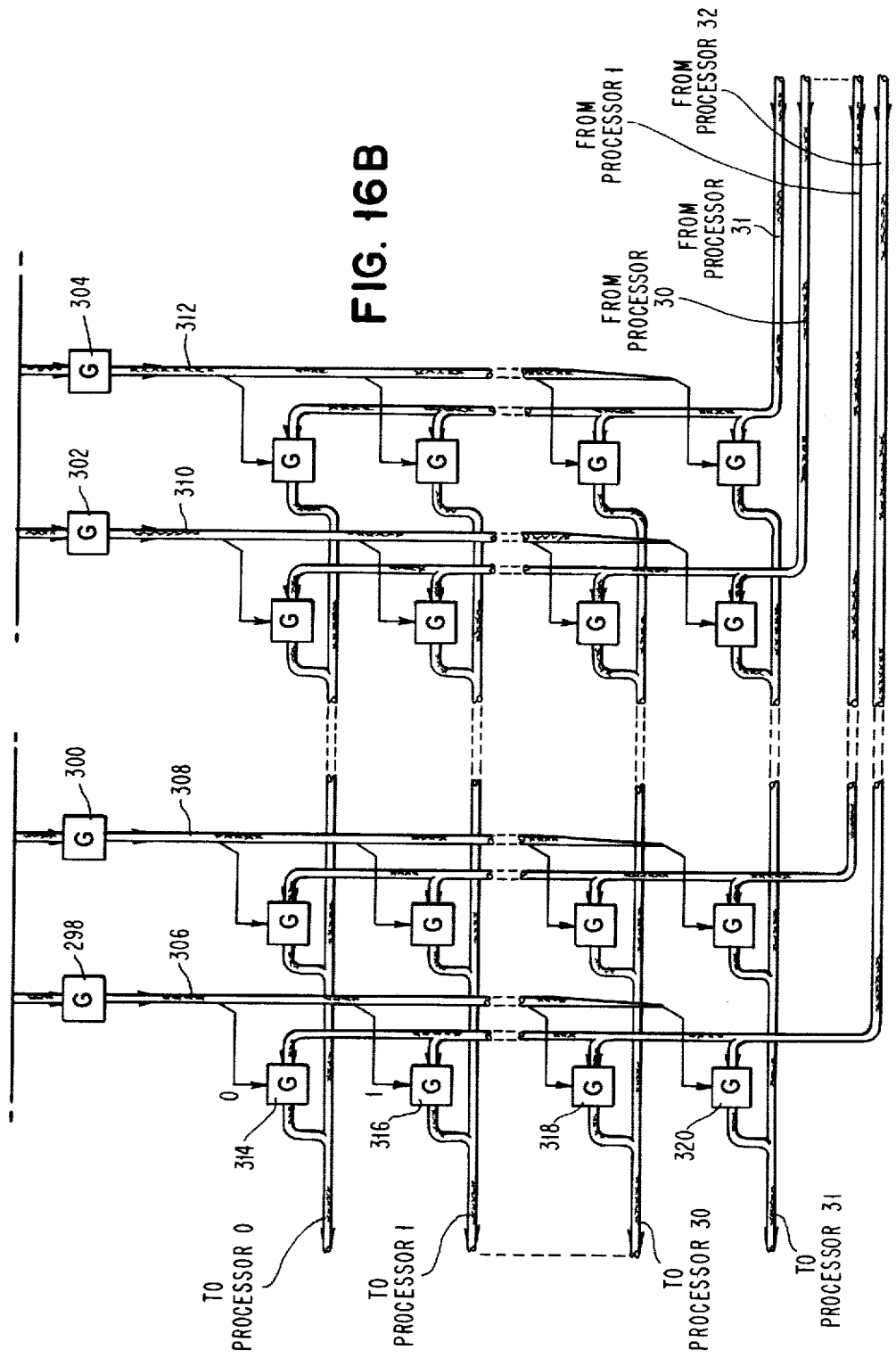

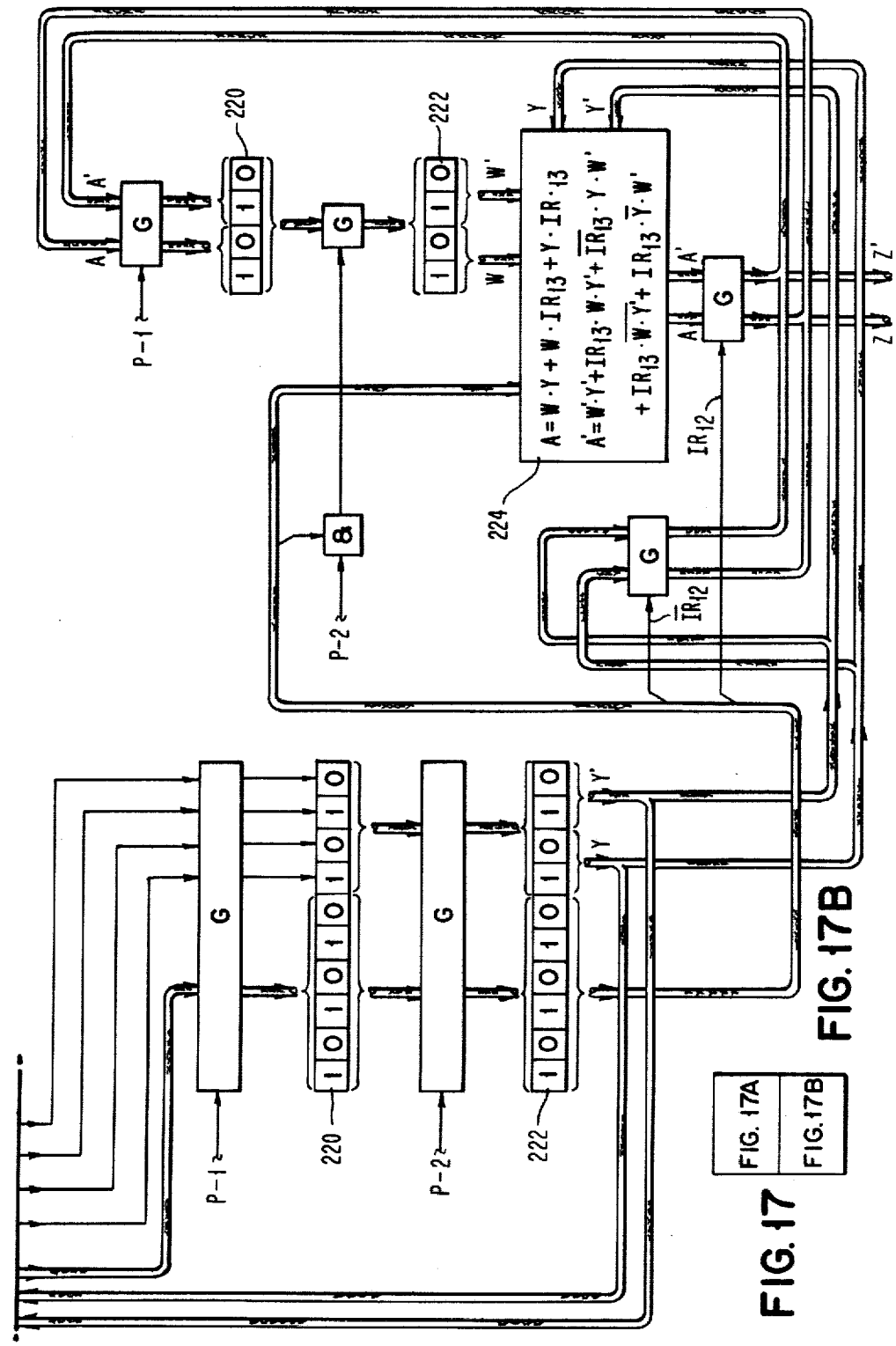

LOGIC SIMULATION MACHINE

DESCRIPTION

Technical Field

The present invention relates to a special purpose, highly parallel computer for the gate level simulation of logic. The logic simulation machine, which may operate in combination with a host computer and a local computer which are used to provide loading functions and to analyze the results of the simulation. The logic simulation machine includes a plurality of separate processors interconnected by a switch to a control processor.

Background Art

The prior art discloses programmable logic networks for deriving predetermined logic relationships, as well as illustrating parallel processing unit environments. An example of the prior art is shown in U.S. Pat. No. 3,902,050 issued Aug. 26, 1975 to Schmidt et. al. entitled, "Serial Programmable Combinational Switching Function Generator" which discloses a device for performing logic operations in which a boolean equation to be solved is serially processed in a manner which results in a large reduction in the number of building blocks required while still allowing the solution of long logic equations.

Other references representative of the prior art are as follows:

U.S. Pat. No. 3,728,534 issued Apr. 17, 1973 to Bertram et al entitled "Constructable Logic System" discloses a constructible logic system comprised in a plurality of connective circuit blocks, where in each of said blocks has identical circuit logic elements. Each circuit can be individually programmed by uniquely connecting the logic elements to form an individual logic function for the circuit.

U.S. Pat. No. 3,458,240 issued July 29, 1969 to Hanson entitled "Function Generator for Producing the Possible Boolean Functions of n Independent Variables", discloses a switching network for producing any one of the possible Boolean functions of n independent variables which comprise a plurality of majority decision logic elements.

U.S. Pat. No. 3,400,379 issued Sept. 3, 1968 to Harman entitled "Generalized Logic Circuitry", discloses logic circuit matrices for the implementation of logic equations from AND and OR gates which are connected according to predetermined rules.

U.S. Pat. No. 3,913,070 issued Oct. 14, 1975 to Malcolm et al entitled, "Multi-Processor Data Processing System", discloses a micro-program controlled data processing system having a plurality of data processors integrally formed within a central processor unit for performing on a priority assigned time slice basis a plurality of data processing functions.

U.S. Pat. No. 3,810,114 issued May 7, 1974 to Yamada et al entitled "Data Processing System", discloses a data processing system wherein a plurality of data processing units including an arithmetic operation unit, memory unit and other units attached to an electronic computer are connected through a main bus in parallel relationship with each other and at least the arithmetic operation unit and memory unit are connected to each other through a supplementary bus.

Other background patents which can be found in the prior art are listed as follows:

U.S. Pat. No. 3,381,117 issued Aug. 2, 1965 to Forslund et al entitled, "Minimal Pin Multipurpose Logic Circuits".

U.S. Pat. No. 3,308,285 issued Mar. 7, 1967 to Winder entitled, "Logic Networks for Realizing Associative Logic Functions".

U.S. Pat. No. 3,614,745 issued Oct. 19, 1971 to Podvin entitled, "Apparatus and Method in a Multiple Operand Stream Computing System for Identifying the Specification of Multitasks Situations and Controlling the Execution Thereof".

U.S. Pat. No. 3,278,732 issued Oct. 11, 1966 to Haynes entitled, "High Speed Multiplier Circuit".

U.S. Pat. No. 3,544,973 issued Dec. 1, 1979 to Borck, Jr. et al entitled, "Variable Structure Computer".

U.S. Pat. No. 4,087,794 issued May 2, 1978 to Beausoleil et al entitled, "Multi-Level Storage Hierarchy Emulation Monitor".

U.S. Pat. No. 4,053,947 issued Oct. 11, 1977 to Carlsson et al entitled, "Method and Apparatus for Executing Sequential Data Processing Instructions in Function Units of a Computer".

U.S. Pat. No. 3,823,321 issued July 9, 1974 to Von Rauch entitled, "Particle-Beam Apparatus Such as an Electron Microscopic or the Like".

U.S. Pat. No. 4,084,224 issued Apr. 11, 1978 to Appell et al entitled, "System of Controlling Procedure Execution Using Process Control Blocks".

U.S. Pat. No. 4,079,455 issued Mar. 14, 1978 to Ozga entitled, "Microprocessor Architecture".

U.S. Pat. No. 4,035,777 issued July 12, 1977 to Moreton entitled, "Data Processing System Including Parallel Bus Transfer Control Port".

U.S. Pat. No. 4,015,246 issued Mar. 29, 1977 to Hopkins, Jr. et al entitled, "Synchronous Fault Tolerant Multi-Processor System".

U.S. Pat. No. 4,057,845 issued Nov. 8, 1977 to Ejiri et al entitled, "Group Control System for Visual Information Processing".

U.S. Pat. No. 4,050,058 issued Sept. 20, 1977 to Garlic entitled, "Microprocessor with Parallel Operation".

U.S. Pat. No. 4,065,808 issued Dec. 27, 1977 to Schomberg et al entitled, "Network Computer System".

U.S. Pat. No. 4,067,058 issued Jan. 3, 1978 to Brandstaetter et al entitled, "Workspace Addressing System".

There is no showing or teaching in the cited prior art references directed to the utilizing identical parallel processing units to derive logic networks as set forth in the present invention.

BRIEF DESCRIPTION OF THE DRAWINGS

FIG. 2 is an illustration of a schematic block diagram of a logic circuit used in explaining the operation of the processors shown in FIG. 1.

FIGS. 3 and 4 are tables used in the explanation of the logic circuit shown in FIG. 2.

FIG. 5 is an illustration of a schematic block diagram of a portion of the structure of a logic unit employed in the processors of the logic simulation machine of FIG. 1.

FIG. 6 is a table used in the explanation of the structure of FIG. 5.

FIG. 7 is an illustration of a schematic block diagram of a further portion of the logic unit of the processors of the logic simulation machine of FIG. 1 used for performing "dotted" or wired logic.

FIG. 8 is an illustration of a schematic block diagram of a specific 3-way collector circuit used in the explanation of the processors of the logic simulation machine of FIG. 1.

FIGS. 13A through 13E, arranged as shown in FIG. 13 illustrate a more detailed schematic diagram of the logic simulation machine of FIG. 1.

FIGS. 14A and 14B arranged as shown in FIG. 14 illustrated a detailed schematic diagram of memory circuits of FIG. 13A.

FIGS. 16A and 16B arranged as shown in FIG. 16 illustrate a more detailed schematic diagram of the inter-processor switch of the logic simulation machine.

FIGS. 17A and 17B arranged as shown in FIG. 17 illustrate the operation of the logic unit of the processors of the logic simulation machine.

DISCLOSURE OF THE INVENTION

Figure 1:
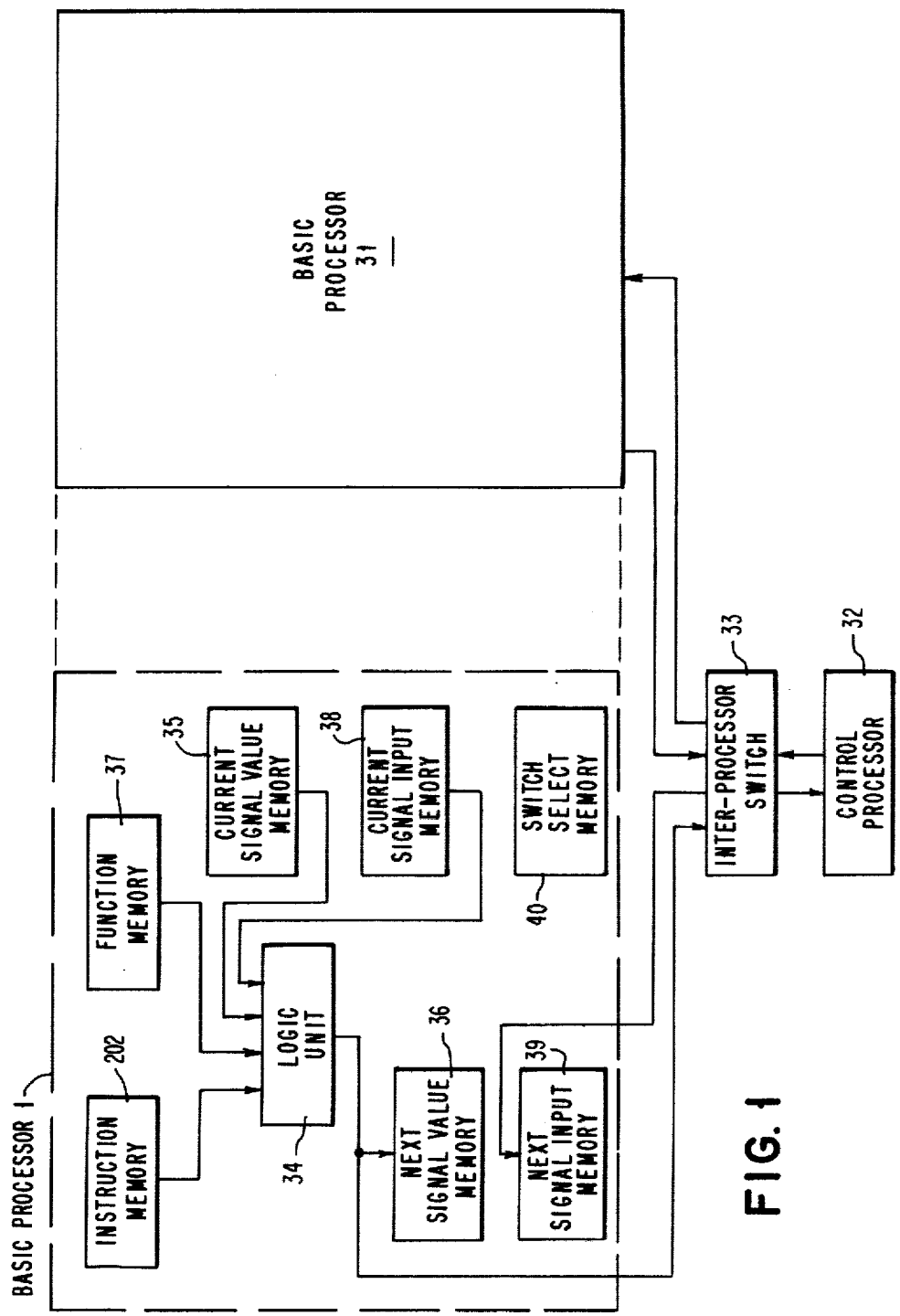
FIG. 1 is an illustration of a schematic block diagram of one embodiment of a logic simulation machine according to the principles of the present invention.

Logic technologies such as very large scale integrated circuits and Josephson technology provide significant improvements in cost/performance and reliability. However, they have disadvantages in that their fault diagnosis is more difficult and their engineering rework cycles are greatly lengthened. These disadvantages exact great economic penalties for design errors and ommissions and place a greater emphasis on the goal of completely verifying designs in advance of engineering models.

One technique for providing design verification is simulation, however, this approach has disadvantages. It lacks the absoluteness of static verification or any other technique actually proving correctness: the presence of errors, not their absence, is all testing can show and it is expensive in computer resources and time-consuming; even with high-level software simulation, it is not feasible to run even short hardware diagnostic programs.

However, if the cost of simulation is decreased drastically and the speed and capacity are increased by orders of magnitude, the situation is altered radically. Since an entire processor can be simulated, far more stringent verification is possible through execution of substantial software tests; and logic can be tested while embedded in a standard processor design, simplifying test sequence creation and effectively providing personal engineering models. Other advantages also arise: Simulation of faults can be used to derive and verify manufacturing and field tests much more economically. The present invention provides a hardware logic simulation machine which manifests the cost, speed, and capacity advances needed to make simulation an effective design verification technique.

The logic simulation machine of the present invention is a special purpose, highly parallel computer for the gate level simulation of logic. It provides logic simulation speeds far beyond those of existing software logic simulators. The embodiment to be described includes thirty one processors which simulate one gate delay for 31K gates.

Since the logic simulation machine is not a general purpose computer, it must be used as a device attached to a computer which can perform for it functions such as compilation, input/output control, etc. The system in which the logic simulation machine will initially be used actually contains two computers in addition to the logic simulation machine.

The two other computers used in the system of the present embodiment may be on IBM System/370 "host" computer and a local computer connected as an interface between the logic simulation machine and the 370 host computer. In the present embodiment the local computer may be IBM Series/1 Model 5 mini computer. Although two general purpose computers are shown in the present embodiment, in alternative embodiments their functions may be performed by one general purpose computer such as the IBM 801. The functions performed by the two general-purpose computers in the present embodiment are to load the logic simulation machine with data and instructions and to analyze the results that the logic simulation machine has obtained in a manner known in data processing art.

More particularly the System/370 host computer provides large computation and file support functions, such as user interface control: command parsing, EXEC execution, result display, etc., compilation of logic simulation machine code and input test sequences, file storage and management, and communication with the local computer. The local computer provides fast turnaround functions, such as control of logic simulation machine execution, e.g., single-cycle execution, communication with the host computer, simulation of large storage arrays (control store, main memory, etc.), application of test input sequences, capture of test output results and insertion/removal of logic faults in fault simulation mode.

Information passed between the logic simulation machine and the host computer is not interpreted by the local computer. The host computer compilation generates information in a form which is directly usable by the logic simulation machine and can be transmitted through the local computer with no change.

The local computer and the host computer are standard machines and are controlled by programs, therefore, their contribution to the system is conventional and they do not form a necessary part of the claimed invention, because it is possible that the logical simulation machine of the present invention could have its instructions and data loaded by manual means and its results analyzed by manual means.

Referring to FIG. 1, the logic simulation machine of the present embodiment is shown including a plurality of basic processors, the number of which may vary although thirty one processors are based in the specific embodiment. The thirty-one basic processors are connected to a thirty-second processor referred to as a control processor through an inter-processor switch. The plurality (thirty-one) basic processors are the computing engines of the logic simulation machine; they simulate the individual gates of the design. All the basic processors run in parallel, each simulating a portion of the logic and each basic processor can simulate up to 1024 single output functions. Because the basic processors run in parallel, increasing their number does not decrease the simulation rate, and may, in alternative embodiments, be used to increase it.

There is one control processor (processor 32 in FIG. 1) in a logic simulation machine. It provides overall control and input/output facilities. Responding to I/O commands from the Series/1, the control processor performs the functions of starting and stopping the basic processors, loading the basic processors with instructions and data and transferring input and output data between the basic processors and the local computer, re-ordering the data for simpler processing by the local computer. In addition, the control processor interrupts the local computer in response to events occurring during the simulation. Such events include the end of the simulation, requests for array simulation within the local computer, and the occurrence of user-defined break-points.

There is one inter-processor switch 33 in a logic simulation machine. It provides communication among the thirty-one basic processors and between them and the control processor 32. Its primary purpose is to communicate simulated logic signals from the basic processor generating them to basic processors using them. In addition, it provides communication between the basic processors 1-31 and the control processor 32 for loading the basic processors, transferring inputs and outputs to the local computer, etc.

In the next section of this description the basic processors 1-31, inter-processor switch 33 and control processor 32 of the logic simulation machine are described on a block diagram level with reference to FIG. 1, then a more detailed description is presented with reference to the schematic drawings of FIGS. 2 through 8.

Basic processors (1 through 31 in FIG. 1) are the computing engines of the logic simulation machine: each simulates the individual gates of a portion of the logic and communicate the simulation results among each other.

The data on which a basic processor operates represent logic signal values. Each datum can represent three values: logical 0, logical 1, and undefined. "Undefined" indicates that the represented signal could be either logical 0 or logical 1. The three values are coded using two bits per datum as follows:

| BIT 0 | BIT 1 | VALUE |
| --- | --- | --- |
| 0 | 0 | logical 0 |
| 1 | 0 | logical 1 |
| 0 | 1 | undefined |
| 1 | 1 | undefined |

Either of the two "undefined" combinations may be initially loaded into a basic processor, and a basic processor may produce either as a result during simulation.

Since bit 1 distinguishes the undefined combinations, it is referred to as "the undefined bit." Since bit 0 distinguishes logical 0 from logical 1, it is referred to as "the value bit."

The use of 00 as logical 0 and 10 as logical 1 is a convention; the reverse could be used. However, the use of combinations 01 and 11 to represent undefined vaues is not a convention; it is built into the basic processor hardware.

The data representation described above is uniformly used throughout the logic simulation machine to represent logic signals.

As illustrated in FIG. 1, each basic processor such as processor 1 has a plurality of internal memories with a logic unit 34 connecting them. Two of these memories are two identical logic data memories which alternately assume one of two roles; that of the current signal value memory 35 and that of the next signal value memory 36. For a clearer explanation of the logic simulation machine, the functions of the logic data memories will be described in terms of these roles.

The current and next signal value memories 35 and 36 contain logic signal representations. Both have 1024 locations, each holding one signal.

The data in current signal value memory 35 are the logic signal values that are currently present in the simulation. The logic unit updates those values, placing the results in the next signal value memory.

The process of updating all the signal values is called a major cycle. The simulation proceeds in units of major cycles, each of which corresponds to a single gate delay. At the conclusion of each major cycle, the logic simulation machine may halt; if it does not, the former next signal value memory is designated to be the current signal value memory (and visa versa) and another major cycle is performed.

Another component of the basic processor of FIG. 1 is the instruction memory 202. The logic unit 34 uses the instruction memory 202 in computing updated logic signal values. The instruction memory has 1024 locations, each containing a single logic simulation machine instruction corresponding to a single 1-output, 5-output gate.

Each logic simulation machine instruction contains a function code field, referred to as the opcode, and five address fields. The function code specifies the logic function to be performed, e.g., AND, NOR, XOR, etc.; this is discussed in more detail hereinafter. The five address fields specify input connections to a gate.

To perform a major cycle, the logic unit 34 sequences through instruction memory 202 in address order, executing each instruction by computing the specified logic function on the five specified values from current signal memory. The result of each instruction is placed in next signal value memory 36 at the address equal to the instruction's address in instruction memory. Thus an instruction (representing a gate) at address X has its result (representing the gate's output) placed at next signal value memory 36 address X; and the gate's output one gate delay earlier resides at current signal value memory 35 address X.

Each execution of an instruction by the logic unit is referred to (somewhat informally) as a minor cycle.

It is important to note that instructions can be executed in any order, i.e., their placement in instruction memory is arbitrary. This is true because updated values are placed in a separate memory, and there are no branch, test, etc., instructions. This has important consequences for communication between basic processors as will be discussed later.

Instructions have fields other than the function code and 5 addresses. These fields are used to perform "dotted" logic and to simulate gates with more than 5 inputs. When these fields are used, instruction execution order is no longer completely arbitrary. These fields are discussed in later sections.

The operation of a basic processor of FIG. 1 will be described using, as an example, the circuit shown in FIG. 2 which includes four NAND gates.

In FIG. 2, the numbers near the gates are the locations in instruction memory of the instructions representing the gates. They are also the locations in current and next signal memory holding the simulated gate outputs. Inputs are asssumed to come from locations 5 and 6.

The instruction memory contents required for simulation are shown (simplified) in the table of FIG. 3.

Addresses 3 through 5 of each instruction are left blank because they are unused in this example; in practice, they might be set to addresses containing constant logical 1's (because the gates are NAND gates).

The table shown in FIG. 4 lists the contents of current signal values memory for four major cycles of this example, starting with inputs of 0 and 1 and all other signal values undefined (shown as asterisks). The gradual extinction of undefined values shows how logic values propagate through the gates. It should be noted that gate 2's output is fully defined at cycle 2, since NAND gate with a 0 input has an output of 1 independent of its other inputs.

When a simulation does not require all of the instruction memory locations, the logic unit may execute fewer than the maximum of 1024 instructions per major cycle. This shortens each major cycle, increasing the simulation speed.

The major cycle length is controlled by a minor cycle count register to be described in more detail hereinafter, which contains the address of the last instruction to be executed in each major cycle (plus a "skew" value). There is a single minor cycle count register for the entire logic simulation machine; it controls the major cycle length in every basic processor.

Use of the minor cycle count register to control major cycle length permits the feature of increasing the number of basic processors to increase the simulation speed.

The logic functions specified in the logic simulation machine instructions are defined by the contents of another basic processor memory, the function memory 37 shown in FIG. 1. The relation of the function memory 37 to other basic processor elements is illustrated in FIG. 1.

Each distinct logic function used in a basic processor during a simulation is defined by the contents of a single location in function memory 37. The function code (op code) of each instruction is the address in function memory 37 of the function's definition.

In the initial implementation of the logic simulation machine, the function memory 37 has 1024 locations. Each location contains 64 bits, one for each truth table entry of a 6 input switching function. (The sixth input is used in the simulation of gates with more than five inputs, described in a later section.) The truth table values in the function memory are 0 and 1; "undefined" values are generated by the logic unit in response to "undefined" input values. For example, assume that all the inputs to an AND function are undefined except for one. If that defined input is 1, the output is undefined. If that defined input is 0, the output is defined and equal to 0.

It is to be noted that since each instruction's function code selects an arbitrary location in function memory 37, there is no necessary one-to-one correspondence between instruction memory 202 and function memory 37 locations. Furthermore, there is no requirement that the function memory 37 have the same number of locations as the instruction memory 202 and the signal value memories.

There must, however, be a one-to-one correspondence between instruction addresses in the instruction memory and the address into which its result is stored.

Gates of more than five inputs (extended functions) are simulated using facilities internal to a basic processor's logic unit. A diagram of the relevant internal structure appears in FIG. 5.

The function evaluation element of the logic unit computes the result of applying a function (truth table) to logic values. On each minor cycle (instruction execution) the output of function evaluation is stored in the logic unit. There is a sixth logic value input to the function evaluation element. The data presented to this input may be either the previous instruction's result (logic unit accumulator contents) or the contents of an immediate data field in each instruction. The choice is determined by each instruction's immediate select flag: 0 selects the logic accumulator contents, and 1 selects the immediate data field. The small box labelled X in the figure represents this choice of input.

A gate with 5 (or fewer) inputs is represented by a single instruction with an immediate select flag of 1. The function definition used must either ignore the constant sixth input or allow it to be some value that will not affect the result when only 5 inputs are used. That is, an immediate logical 0 allows a 6-input OR function definition to be used to simulate 5-input OR gates.

A gate with more than 5 inputs must be represented by two or more successive instructions. The second through last instructions all use the preceding instruction's results (logic unit accumulator contents) as their sixth input. The output of the simulated gate. Prior instruction results are stored in the next signal value memory, but do not correspond to elements of the simulated machine.

For example, suppose a 15-input NOR gate is to be simulated. Assuming its inputs come from locations 101 through 115, an appropriate instruction sequence is shown in the table of FIG. 6.

The first instruction in the table selects an immediate logical 0 as its sixth input. The other two use the previous instructions' output as the sixth input, so their immediate fields are irrelevant (indicated by Xs in the table). The functions shown (two ORs followed by a NOR) cause the last instruction's output to be the NOR of all 15 inputs.

It is to be noted that no other instructions may intervene in a sequence of instructions computing a function of more than five inputs in this manner, since they would destroy the logic accumulator contents.

This method of simulating extended functions corresponds to a functional decomposition that is easy to perform for the most common logic primitives: AND, OR, NAND, NOR, EXOR, etc. For those primitives, the decomposition needed follows directly from the associativity of AND, OR, and EXOR, e.g., the decomposition used in the fifteen input NOR example above was

NOR(A,B,C,D,E,F, . . . )=NOR(OR(A,B,C,D,E),F, . . . ).

For more general functions, the needed decomposition is more difficult to find, it it exists at all. Simulation of such more general functions can be done in a straightforward fashion by use of the logic simulation machine facilities for "dotted" logic presented in the next section.

"Dotted" (or "wired," or "wire-tied") logic, performed in hardware by directly connecting gate outputs, can be simulated by use of logic unit elements labelled dotting logic and dot accumulator in FIG. 7. These elements are controlled by three flags in each instruction: the SAVE FOR DOT flag, the DOT SELECT flag, and the DOT FUNCTION flag.

When SAVE FOR DOT is 1, the output of the logic unit for the instruction is stored in the dot accumulator. Otherwise, the instruction does not modify the Dot Accumulator.

When DOT SELECT is 1, the output of the logic unit, which is the value stored in next signal value memory, is a function (AND or OR) of the current dot accumulator contents and the output of the current instruction (logic unit accumulator contents). This final value may be saved in the dot accumulator by using the SAVE FOR DOT flag.

When the DOT SELECT flag is 0, the logic unit accumulator contents for the current instruction is stored directly into the next signal value memory. No interaction with the current contents of the dot accumulator occurs.

DOT FUNCTION defines the "dotted logic" function performed: DOT FUNCTION=0 selects AND, and DOT FUNCTION=1 selects OR (assuming the convention that 00 is logical 0 and 10 is logical 1; the opposite convention reverses the DOT FUNCTION meanings.) DOT FUNCTION is active only when DOT SELECT is 1.

As an example, reference is made to FIG. 8, which shows a 3-way collector dot ("dotted OR"). The numbers near the gates are instruction memory addresses for instructions representing the gates; the numbers at the inputs are addresses of the input data, and the number at the output is the address where the final dotted result is placed in next signal value memory.

Figures 9, 10, 11, 12:
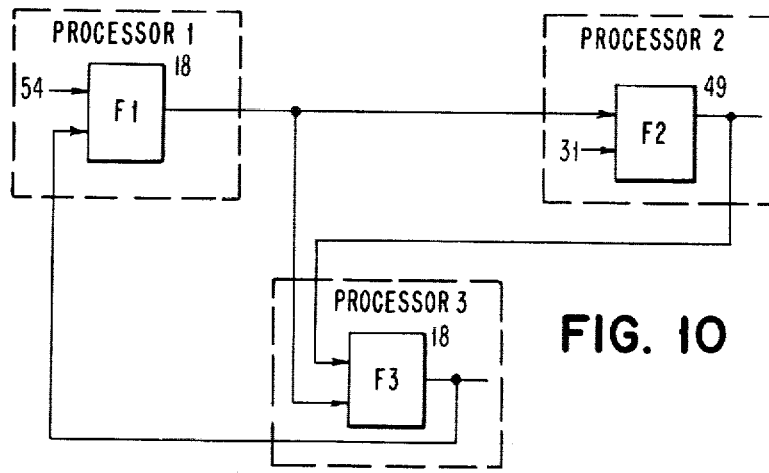
FIG. 9 is a table used in the explanation of the operation of the circuit of FIG. 8.
FIG. 10 is an illustration of a schematic diagram of a portion of a processor of FIG. 1 for describing the operation of the communication between processors.
FIGS. 11 and 12 are tables used in the explanation of the structure of FIG. 10.

The table of FIG. 9 shows instructions implementing the simulation of dotting for the example. Unused inputs have been left blank for clarity, and the immediate select and immediate value fields were left out also since they are not relevant to the example.

The first instruction in the table just saves its result. Its DOT FUNCTION flag is immaterial (indicated by an X) since its DOT SELECT flag is 0. The second instruction ANDs its result with the saved first instruction's result and saves that. (Note that AND is used since the common term "wired OR" actually refers to the opposite logic convention.) The third instruction also ANDs its result with the saved dotting result; its output is the final dotted logic result, so it does not save for further dotting.

Note that several instructions can intervene between two whose outputs are to be "dotted" together, providing they do not alter the dot accumulator. This allows the simulation of "wired logic" between gates of more than five inputs.

The dotted logic facilities of the logic simulation machine can also be used in simulating gates with more than 5 inputs. This is particularly useful for simulating gates implementing complex functions since a decomposition into product-of-sums or sum-of-products form can be the basis of the representation used. Individual instructions perform the first level of the decomposition (the several sums or products), and the dotting logic is used to perform the second level (the single outer level product or sum).

It was previously stated that the order of instructions in the instruction memory was not relevant. This is clearly not true for sequences of instructions using the logic unit accumulator and dot accumulator. However, such sequences are typically needed only to simulate a small minority of a device's logic, and a sequence as a whole can be arbitrarily positioned in instruction memory.

The primary function of the inter-processor switch 33 of FIG. 1 is to communicate instruction results from the basic processors generating them to basic processors using them. That function will now be described.

The inter-processor switch 33 connects all the basic processors 1-31 and the control processor 32. This is illustrated in FIG. 1.

The communication of results between processors makes use of additional memories within each basic processor as shown in FIG. 1.

The function of these memories in providing inter-processor communication through the switch is described below.

As illustrated in FIG. 1, each basic processor has two additional internal logic data memories. These are identical to the current and next signal value memories 35 and 36 previously discussed. Like the signal value memories 35 and 36, these additional memories alternately assume one of two roles: that of the current signal input memory 38 and that of the next signal input memory 39. Their functions will be described in terms of these roles. The actual data memories have been called the A-IN memory and the B-IN memory.

Like the signal value memories 35 and 36, the current and next signal input memories 38 and 39 contain representations of logic signals. Both have 1024 locations, each holding one signal.

The data in current signal input memory 38 are logic signal values that are currently present in the simulation, and were generated by other basic processors. This data is selected by use of ADDRESS SOURCE flags in each basic processor instruction. Each of the five addresses in an instruction has an associated ADDRESS SOURCE flag. When it is 0, the address references data in current signal value memory; when 1, the address references data in current signal input memory. Thus any or all of the data used in computing a logic function can come from other processors.

In the course of a major cycle, updated values are obtained from the inter-processor switch 33 and placed in the next signal input memory 39; and at the end of each major cycle, the former next signal input memory is designated to be the current signal input memory (and visa versa).

The switch select memory 40 of each basic processor has 1024 locations, each containing the address of a basic processor. The inter-processor switch 33 uses the switch select memory 40 to place updated logic signal values in the next signal value memory 36 as follows:

The result of each instruction, the value stored in a basic processor's next signal value memory 36, is always sent to the inter-processor switch 33 by every processor, as indicated in FIG. 1. Furthermore, the major and minor cycles (instruction executions) of all basic processors are synchronized: every basic processor executes its Kth instruction at the same time. Thus, all processor's results are sent to the inter-processor switch 33 simultaneously, in the order of their addresses in next and current signal value memories 36 and 35.

The switch select memory 40 and next signal input memory 39 are also stepped through in address order, synchronized with instruction execution. At each minor cycle, the switch sends to each basic processor the current output of the basic processor addressed by the current switch select memory 40 location. This output is placed in the current location in next signal input memory 39. Thus, if a basic processor's switch select memory 40 has Q in location Z, it receives the Zth output of basic processor Q; this is placed in location Z of its next signal input memory 39.

The tables shown in FIGS. 11 and 12 show the switch select memory 40 and instruction memory 202 contents providing the required communication for the circuit shown in FIG. 10, assuming the allocation to processors shown in FIG. 12. The numbers in FIG. 12 are instruction/data locations corresponding to the gates and signal lines shown. Unused elements have been left out of the instructions for clarity.

Since processor 3 needs Processor 2's 49th output, the table of FIG. 10 shows a 2 in processor 3's 49th switch select memory to location. This places the needed value in processor 3's 49th next signal input memory 39, so the table of FIG. 11 shows processor 3's 18th instruction accessing that location with its second address. The other table elements are derived similarly. It should be noted that at minor cycle 18, Processor 1 simultaneously transmits and receives, sending data to Processors 2 and 3 and obtaining it from Processor 3.

Suppose a basic processor needs data generated in two other processors, and they generate it at the same minor cycle (same instruction location). The needed communication cannot be performed, since a basic processor can receive the output of only one other processor at each minor cycle.

However, instruction execution order is arbitrary (except for extended functions and "dotted" logic), so instructions can be ordered in instruction memory 202 to avoid such conflicts. The problem of discovering such an ordering is called the scheduling problem.

The scheduling problem must be solved by the logic simulation machine compiler for each device to be simulated. Just as physical components must be placed and wired, simulated logic must be partitioned among the processors and scheduled.

Partitioning and scheduling is readily achieved in the logic simulation. Communication can be scheduled even when extremely simple partitioning is used, such as, placing the first N gates in processor 1, the next N in processor 2, etc. Even examples containing substantial use of the logic accumulator may be successfully scheduled using this simple partitioning.

The control processor 32 of the logic simulation machine provides two functions of particular interest, they are organizing signal values into functional groups so that they can read from or written into the logic simulation machine with a single local computer (Series/1) input/output operation, and halting the logic simulation machine and interrupting the local computer when any of a group of selected signals are set to specified values.

The first function provides for efficient application of input sequences and gathering of data by the local computer. The halting function is the basic mechanism for informing the local computer of events in the simulation such as user-defined events or requests for array read or write. The control processor including these two functions are discussed as follows.

The control processor 32 contains two counters which are of use in controlling overall logic simulation machine execution.

The control processor also provides general logic simulation machine control function, such as, starting the logic simulation machine, halting it, etc. These are provided via commands from the local computer which utilize the control processor in a transparent manner.

The control processor contains six memories referred to as a switch select memory, and output signal memory, and input signal memory, and output permutation memory, an input permutation memory, and an event mask.

The characteristics and functions of each of these memories are described below.

The switch select memory of the control processor and its connection to the inter-processor switch 33 are identical in configuration and operation to switch select memory 40 of a basic processor as shown in FIG. 1. Data is sent to the inter-processor switch 33 from the control processor 32 each minor cycle; and the control processor's switch select memory determines the basic processor from which it receives data each minor cycle.

The input and output signal memories serve as a sink and a source, respectively, of logic data communicated between the control processor 32 and the basic processors 1–31 via the inter-processor switch 33. Both has 1024 locations, each holding a single signal.

In contrast to other signal data memories in the logic simulation machine, no internal logic simulation machine action ever reads the contents of the input signal memory; it is read only into the local computer main storage via its input/output operations. Similarly, no internal action ever alters the contents of the output signal memory; it is loaded only from the local computer main storage via its input/output operations. In addition, no swapping of these memories occurs between major cycles.

The function of the input and output permutation memories is to permute the transmission order of values in the input and output signal memories respectively. Each of these memories contains 1024 locations of 10 bits each; an address in the associated signal memory is contained in each location.

Every major cycle, the input permutation memory is cycled through in address order, synchronized with basic processor instruction execution. The address in the current input permutation memory location is used as the address in input signal memory where data currently received from the inter-processor switch is placed. The output permutation memory is cycled through in the same manner. The contents of each location is used as the address in the output signal memory from which data is sent to the interprocessor switch 33.

This permutation of signal order allows data to be functionally grouped in the output signal memory, minimizing the local computer input/output operations needed to alter it. Such functional grouping might otherwise be impossible to achieve, due to the requirements of scheduling inter-processor data transfers through the inter-processor switch 33. For example, a set of test inputs can be positioned in contiguous locations of the output signal memory and stored there with a single local computer input/output operation; appropriate output permutation memory contents can then feed that data to the switch at the minor cycles to which they have been scheduled for conflict-free inter-processor communication.

The event mask in control processor 32 allows the logic simulation machine to halt in response to events in the simulation itself, i.e., the setting of some simulated signal(s) to selected value(s).

The event mask contains 1024 locations of 4 bits each. Each of the bits corresponds to an individual value of the 2-bit code for simulated signal values: the first bit corresponds to 00, the second to 01, the third to 10, and the last to 11.

The event mask, in parallel with the output and input permutation memories of control processor 32, is cycled through in address order as part of a major cycle. As each signal value is received from the inter-processor switch 33, it is matched against the contents of the current event mask location. If that location contains a "1" corresponding to the signal value, the simulator is halted at the end of the current major cycle and an interrupt is presented to the local computer.

It should be noted that event mask locations correspond to signal values in the order they are received from the switch, not in the (permuted) order of storage in input signal memory.

Since the event mask can have more than a single "1" in each location, any of several values of a particular signal can be made to cause the simulator to halt. For example, the simulator could be halted when a particular signal is set to anything except logical 0.

Since the logic simulation machine only halts at the end of a major cycle, thus ensuring consistency of all simulated signal values, more than one signal value can match the event mask settings before the halt and interrupt, effectively causing a halt for several reasons simultaneously. For this reason, the local computer is given no direct indication as to which signal value caused the halt. Instead, controlling software in the local computer must read the contents of the input signal memory to determine which signal value(s) caused the halt. This implies another use of the output permutation memory: all the simulated signal values which could cause a halt can be grouped in input signal memory and thus read by a single local computer input/output operation.

The control processor also contains two identical counters called level counter 1 and level counter 2, each 16 bits long. They can be loaded via local computer input/output commands, and are decremented each major cycle. When either reaches 0, the local computer is interrupted.

These counters can be used for various purposes. For example, one can count the major cycles (gate delays) per logic cycle of the simulated device, giving the Series/1 an interrupt when it is time to gather an output vector and apply a new input vector. The other can count the total number of major cycles a simulation is to run.

Figure 13A:
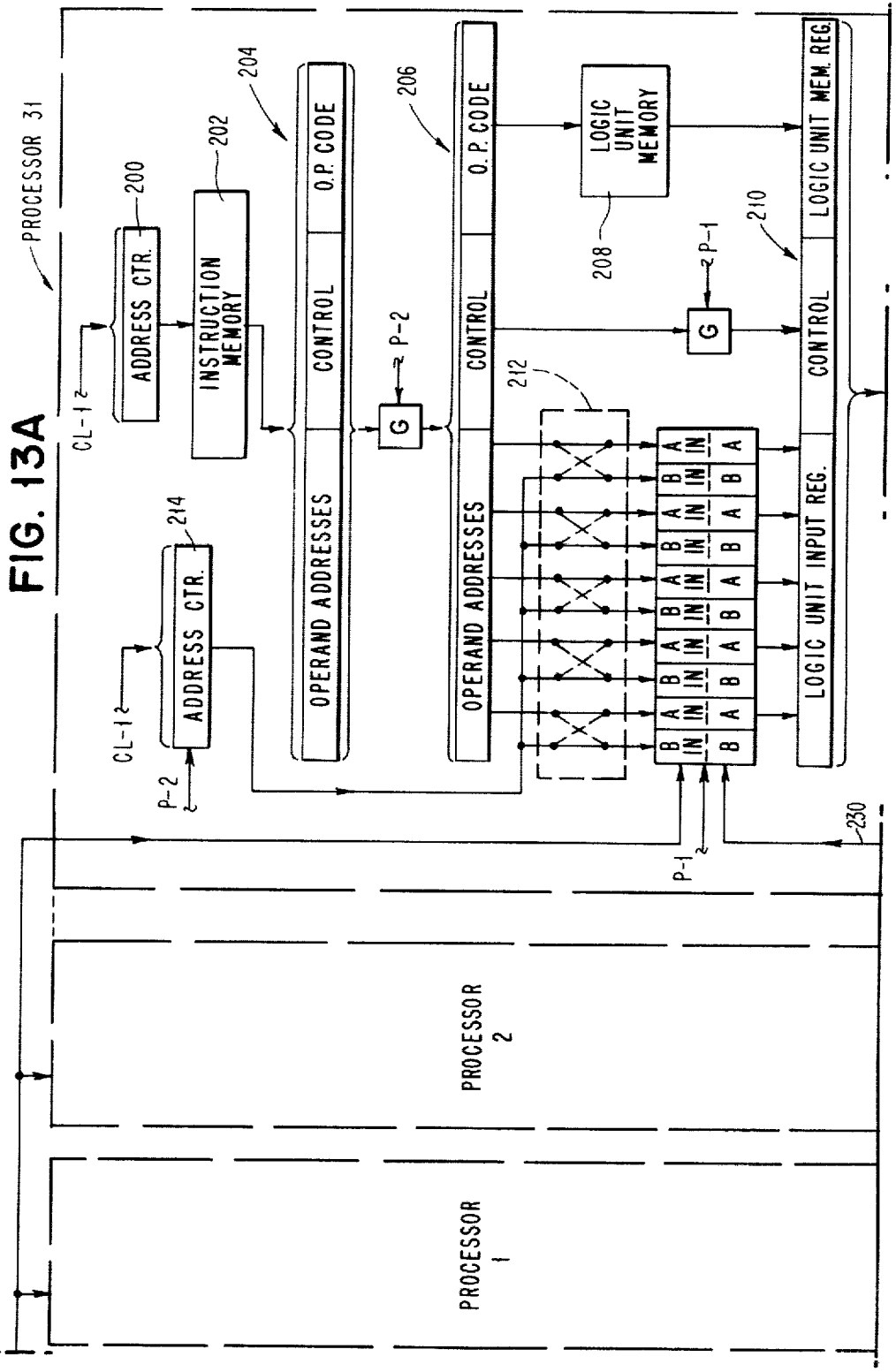

A more detailed description of the logic simulation machine shown in block diagram form in FIG. 1 will now be provided. FIGS. 13A, 13B, 13C, 13D and 13E shown can be arranged as shown in FIG. 13. FIGS. 13A, 13B, 13C and 13D illustrate the entire logic simulation machine and FIG. 13E is an illustration of waveforms used in the description of FIGS. 13A through 13D.

Figure 13B:
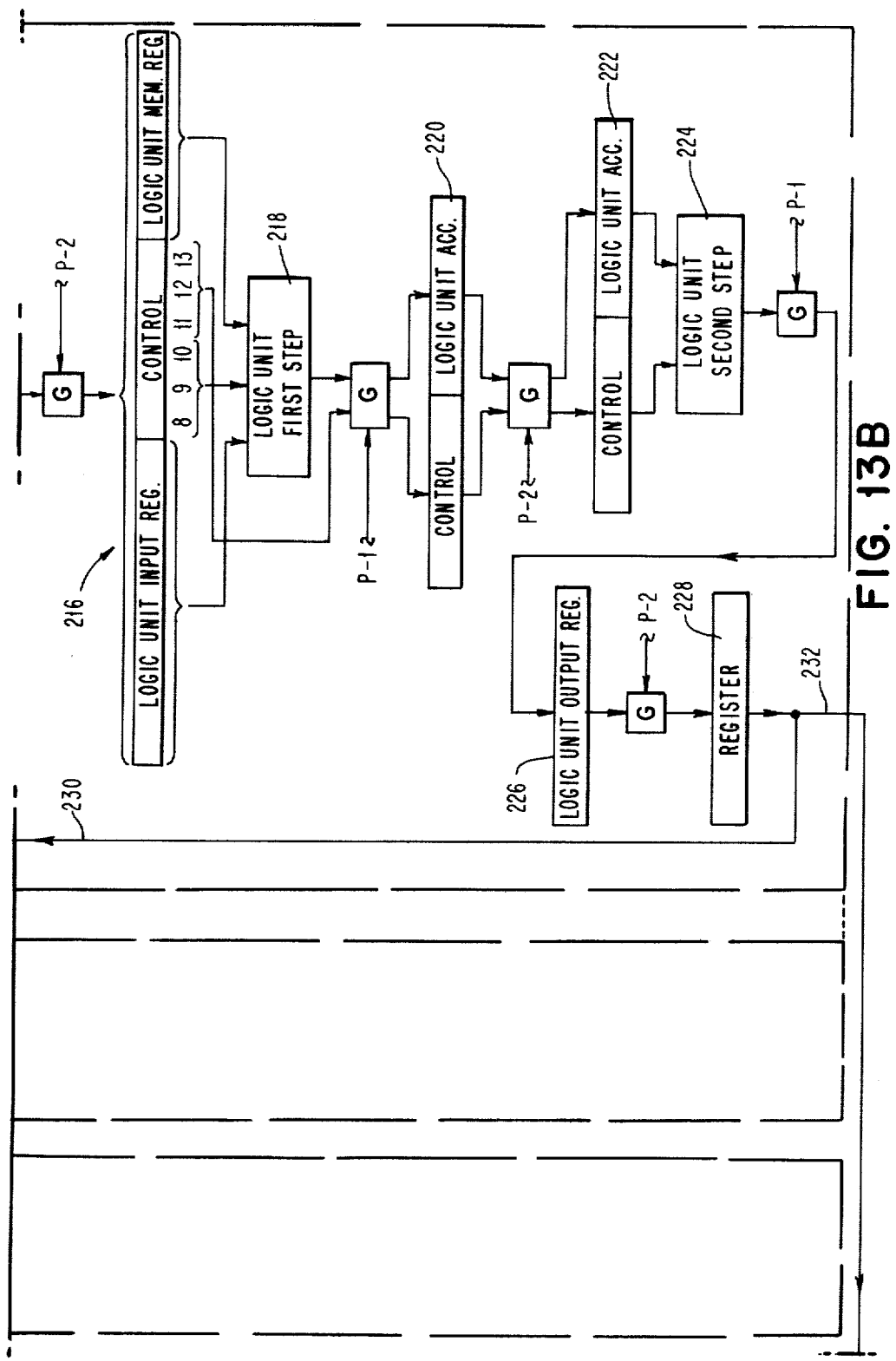

Referring to FIGS. 13A and 13B, and as previously stated, there are thirty-one processors numbered from number 1 to number 31 as also shown in FIG. 1. Processor number 31 is shown in diagrammatic form on FIGS. 13A and 13B.

Also as previously stated, the actual number of the just mentioned processors is not important. There could be more processors or less. The number of thirty processors is chosen as one example of a practical machine embodiment of the invention. In addition to the processors number 1 through 31, there is control processor 32 also shown in FIG. 1, which is shown on FIGS. 13C and 13B. Control processor 32 will be described in detail later and as previously stated is used mainly to accumulate the results and to provide the control pulses which are needed for the entire logic simulation machine of this embodiment.

In FIG. 13A, the address counter 200, is used to supply addresses to the instruction memory 202. In the present embodiment, the instruction memory 202 has provisions for 1024 words. This number is only used as an example, and a greater or lesser number of words may be used. Actually, in the operation of the described machine, the total number of 1024 words in the instruction memory 202 may not be used as will be understood in the later description.

From the instruction memory 202, words are read into the instruction register 204. Because of the pipelined structure of the machine, a second instruction register 206 is needed into which the same word is read by the P-2 gate pulse also illustrated in FIG. 13E. The register 206 then acts as an input register to the "logic unit memory" 208 and to the memories labelled A, B, A IN and B IN. The left hand section of register 206 holds five operand addresses. The middle section of this register holds some control bits and the right-hand portion hold the operation code. The operation code in the right-hand portion of register 206 acts as an address to the logic unit memory to place a word in the "logic unit memory register" section of register 210. The control section is passed from register 206 to register 210 by the P-1 gate pulse which is also shown in FIG. 13E. The A and B memories and their sections A IN and B IN are special memories and will be described more in detail later. At this point in the description, it can be mentioned that either the A and A IN or the B and B IN memories can be read and placed in the "logic unit input register" of register 210. As previously described, and as will be explained in more detail later, there are "minor cycles" and "major cycles" in the logic simulation machine operation. During a "minor cycle" one instruction in the instruction memory 202 on FIG. 13A is read and processed. A "major cycle" can consist of 1,024 of these "minor cycles". The function of the A, B, A IN and B IN memories is that they are used alternately. For example, during one major cycle the A and A IN memories may be read.

In the next "major cycle" the B and B IN memories will be read. The switching between the A and A IN and the B and B IN memories is accomplished by the switching mechanism indicated by the dotted line 212 on FIG. 13A. If it be assumed that, in a certain major cycle, the A and A IN memories are read out of in this same major cycle, the B and B IN memories can be read into. When the A and A IN memories are read out of, these two memories are regarded as a single memory. The A and the A IN are both memories addressed by the low order ten bits of the operand in register 206 while the high order bit of this same operand selects which of the two (A or A IN) memories is actually read. In other words, the operands in register 206 are eleven bits. When the A, A IN, B or B IN memories are written into, each one of these memories are regarded as separate memories and are both addressed by ten bits which is contained in the address register 214 on FIG. 13A. These memories will be described in much more detail later on in the description.

Referring again to FIG. 13A, information in register 210 is transferred to register 216 by the P-2 gate pulse. This permits the information in register 216 to be applied to the LOGIC UNIT FIRST STEP. This "logic unit first step" 218 will be described in more detail later. The output of the "logic unit first step" 218 and also the control bits numbers "11", "12" and "13" are transferred 220 on FIG. 13B by the P-1 gate pulse. From register 220 these data are gated to register 222 by the gate pule P-2. Register 222 serves as the input register for the "logic unit second step" 224. The "logic unit second step" 224 will be described in more detail later. From this unit, the results are gated to the logic unit output register 226 by the pulse P-1.

From register 226, information is gated to register 228 by the P-2 gate pulse. These delay registers are necessary in the machine because of the "pipe-lining" used in the design. From register 228 it can be seen that data has two paths. One is back to the processor via cable 230 so that information can be written into either the A or B memories according to the setting of the switches represented by reference character 212. The other path for data is via cable 232 which goes to the inter-processor switch. Depending on the setting of the gates in the inter-processor switch 33 shown in FIG. 1, information can be gated from any processor back to itself or to any other processor in the group from processor number 1 through processor number 32. When this information comes in from the inter-processor switch 33 it always goes into either the A IN or the B IN memories. This the inter-processor switch has been previously discussed will be described in more detail later.

Figure 13C:
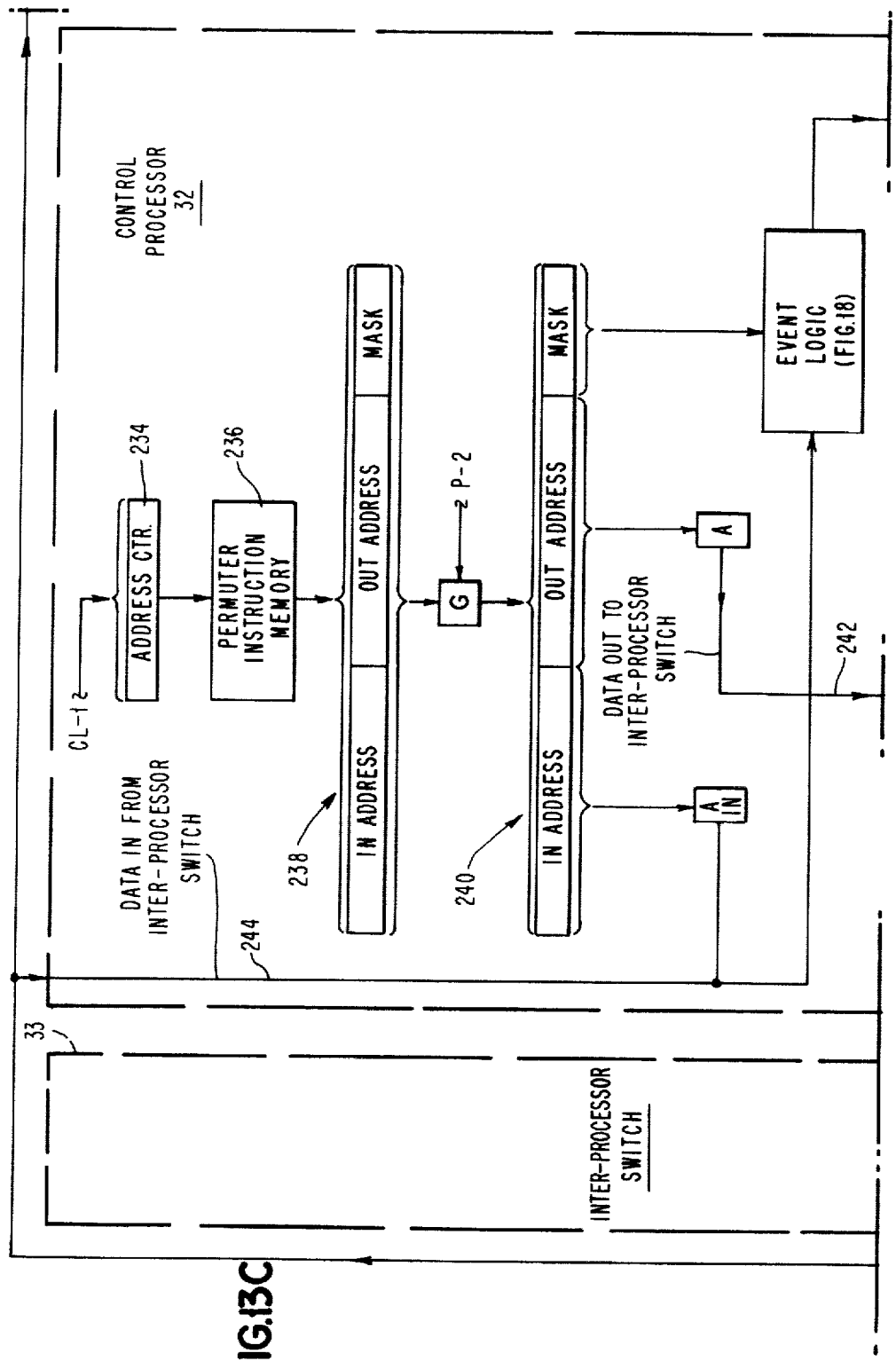
Figure 13D:
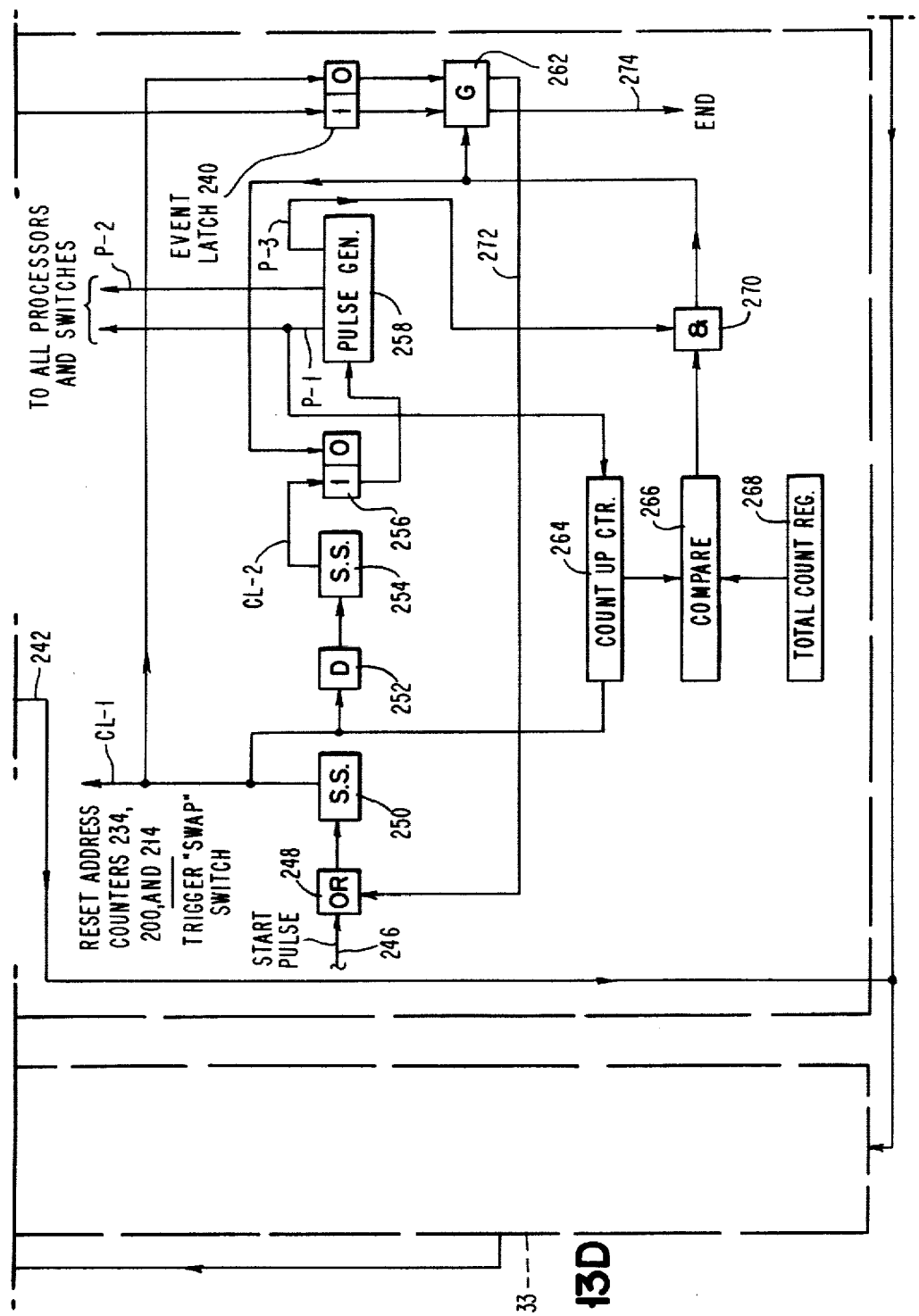

Reference should next be made to FIGS. 13C and 13D for the description of the control processor 32. Control processor number 32 permits and accumulates information produced by other thirty-one processors, keeps track of "events" and contains all the pulse generation equipment used to control the whole machine of this embodiment. On FIG. 13C, the "address counter" 234 is used to address the "permuter instruction memory" 236 which again can contain up to 1024 words. This memory is read by the P-1 gate pulse and the memory word is placed in the register 238. From register 238 the information is gated to register 240 by the P-2 gate pulse. Register 240 controls the reading and writing of the A and A IN memories and also provides an input to the "event logic" which is shown in detail on FIG. 16.

The A and A IN memories are used differently in processor number 32 than in the other thirty-one processors. The data is always read out of memory A and goes by cable 242 to the inter-processor switch. The data from the switch is written into memory A IN. On FIG. 13C, it will be noted that data coming in from the inter-processor switch 33 on cable 244 is not only applied to the memories but also serves as an input to the event logic.

Referring to the right side of FIG. 13D, the logic simulation machine of this embodiment is started by a "start" pulse applied to the lead 246. This pulse extends through the or circuit 248 to turn "on" single shot device s50. This produces the CL-1 pulse shown in FIG. 13E which is used to reset the address counters and to trigger the "swap" switch. The "swap" switch is used to switch the A and B memories in the various processors. The CL-1 pulse is also used to set the "event latch" 260 to its "0" state and also to reset to "0" the "count up counter" 264. After the CL-1 pulse disappears, the delay circuit 252 will have an output to turn "on" single shot device 254 in order to produce the CL-2 pulse. The CL-2 pulse sets the flip flop 256 to its "1" state thus turning on the pulse generator 258. The pulse generator 258 produces the P-1, P-2 and P-3 gate pulses in succession as shown by the timing chart of FIG. 13E. The P-1 and P-2 gate pulses are used to step the pipeling of the machine. The P-3 gate pulse is used to test the output of the compare unit 266. The "total count register" 268 initially set for the total number of minor cycles required.

A "minor" cycle can be considered to be a time required to produce a single train of three gate pulses. In other words the time to produce a single train consisting of P-1 gate pulse, a P-2 gate pulse and a P-3 gate pulse. The "total count register" 268 is set to a number which is equal to the total number of "minor" cycles plus the number of cycles required to run the last data through the pipeline. The "count up counter" 264 is incremented each "minor" cycle by the P-1 gate pulse. When the "count up counter" 264 is equal to the "total count register" 268, a pulse will be produced by the "compare unit" 266 which extends to the AND circuit 270 which is tested each "minor" cycle by the P-3 gate pulse. The pulse produced by the AND circuit 270 at this time extends to flip flop device 256 to reset it to its "0" state thus turning off the pulse generator 258. The same pulse is also applied to gate 262 in order to test "event latch" 260. If the latch 260 is still on its "0" state, a pulse will be produced on wire 272, which extends through or circuit 248 to again turn "on" single shot device 250 in order to start a new major cycle. If the "event latch" 260 is in its "1" state, a pulse will appear on lead 274 to signal the end of operations. This timing chart of FIG. 13E will be understood better when the detailed circuits whown in the remaining figures are described.

Figure 14B:
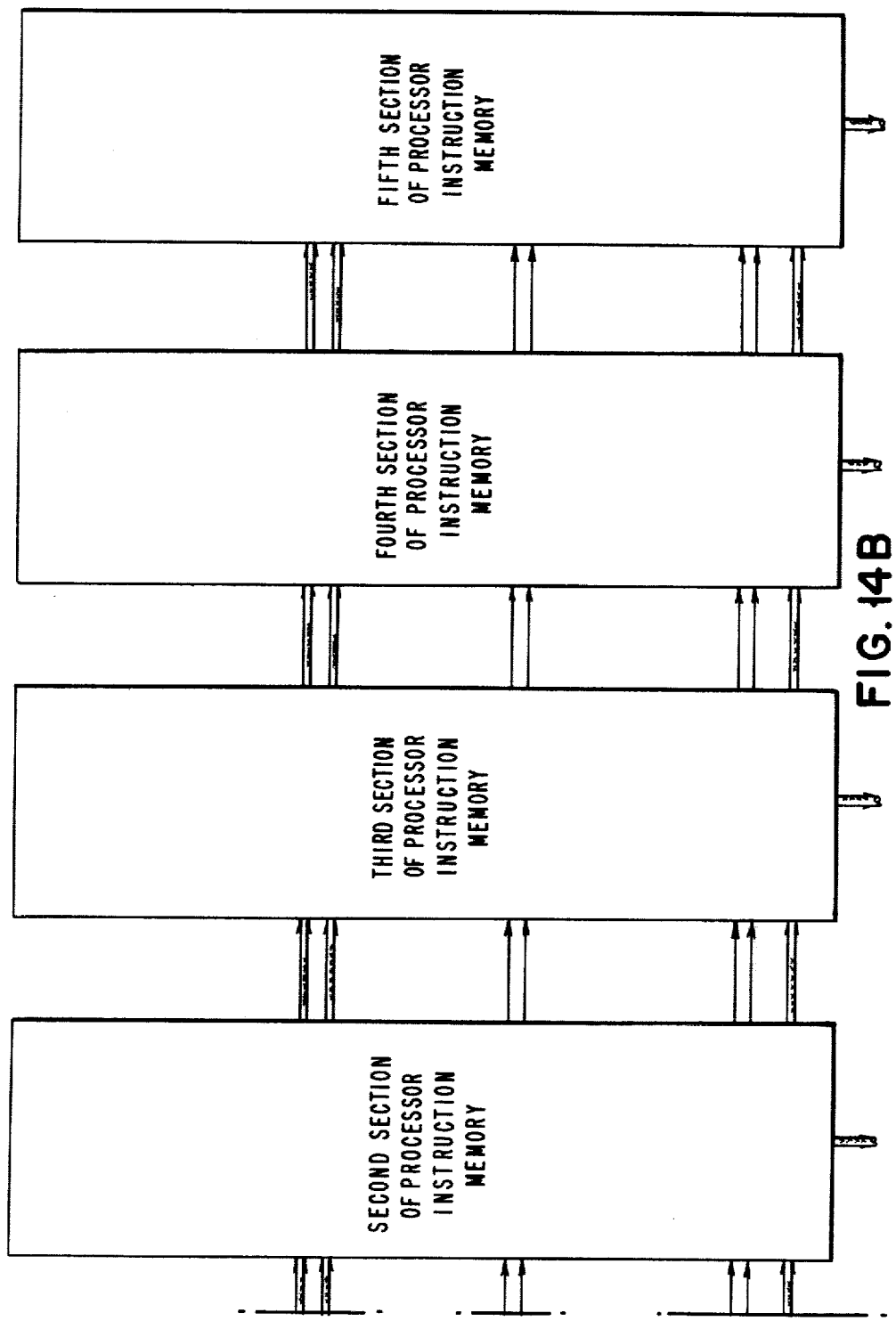

Reference should next be made to FIGS. 14A and 14B (arranged as illustrated in FIG. 14) which show the detailed circuitry for the A, B, A IN and B IN memories. These are the memories shown on the right portion of FIG. 13A. These memories are grouped into five groups of four each. One group is shown in detail on FIG. 14A. Each memory has a capacity of 1024 words and each word is two bits long. In the beginning, before the logic simulation machine is started, all memories are loaded with initialized data.

The five operand addresses existing in the register 204 on FIG. 13A are fed to the five memory sections in FIG. 13A and therefore, five stored values are presented to register 210 on FIG. 13A each time a read-access is performed on the memories. Depending on the setting of the switch 276 at the left side of FIG. 14A, the memories A or A IN will be read or the memories B or B IN will be read. At this point, it is important to note that the A or A IN memories or the B or B IN memories are read as a single memory.

The low order ten bits of the operand section of the processor instruction memory 204 are used to address both A and A IN or both B and B IN. The high order bit or, the eleventh bit of this operand section is used to select either the normal or the IN sections. The important consideration at this point is that when these memories are read, the A and the A IN memories or the B and the B IN memories are read as a single unit. This is not true when the memories are written into as will be described later. When these just mentioned memories are written into, they are addressed separately by the address counter 214 shown at the upper left of FIG. 14A which has only ten bits. The switches represented by the reference character 212 on FIG. 13A, are shown on FIG. 14A by the gates 278, 280, 282 and 264. These gates are controlled by the switch 276. If switch 276 is in its "0" position, the gates 278 and 284 will be enabled thus permitting the memories A, or A IN to be read out of and the memories B, and B IN be written into.

The read and write pulses are applied to the memories on FIG. 14A by the P-1 pulse through gate 286.

Figure 15:
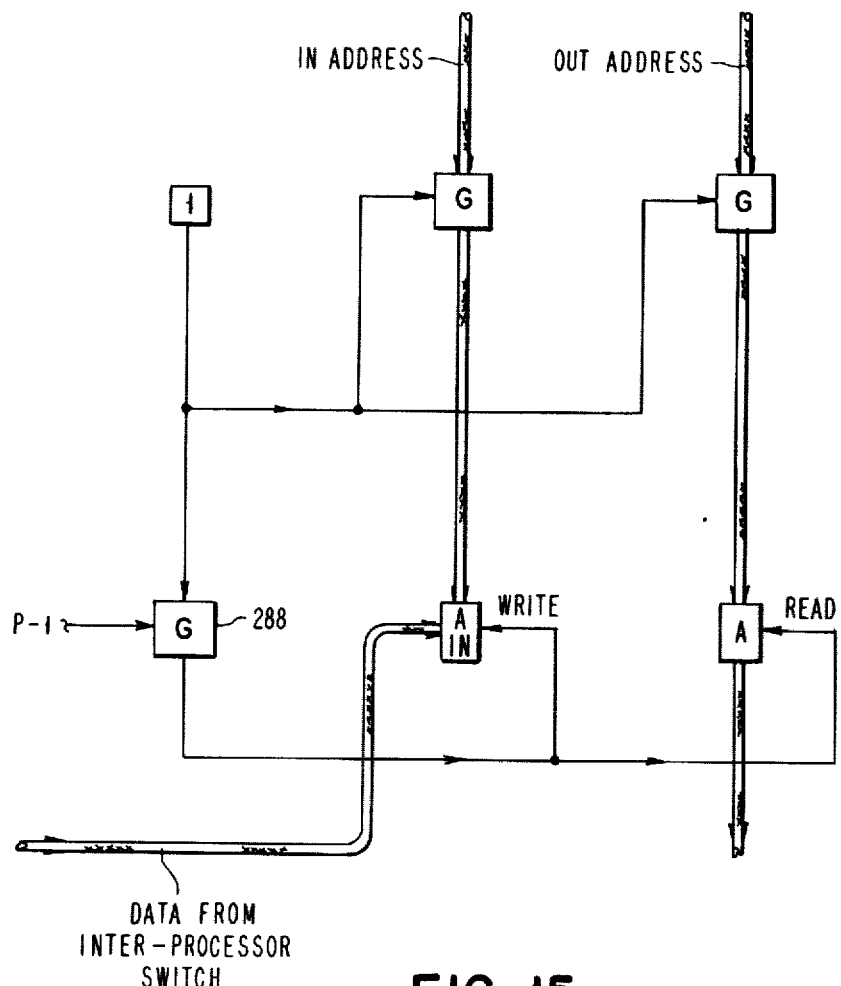
FIG. 15 is an illustration of a more detailed schematic diagram of the memories used in the control processor of the logic simulation machine.

Reference should next be made to FIG. 15 which shows the A and A IN memories for the control processor number 32. These memories are similar to those in the other processors except that they are used in a much simpler manner. Information is always read out of the A memory and always written into the A IN memory. Reading and writing of the memory is done by the P-1 pulse which is applied to the gate 288.

Reference should next be made to FIGS. 16A and 16B, arranged as shown in FIG. 16 which is a detail of the inter-processor switch which is indicated in FIG. 1 and by the dotted lines on the left side of FIGS. 13C and 13D. The inter-processor switch has its own address counter 290 which supplies addresses to the switch memory 292. Memory words are placed into the register 294 by the P-1 gate pulse and later transferred to register 296 by the P-2 gate pulse. There are thirty-two sections of the five bits each in register 296 and each one of these sections is decoded into one of thirty-two leads. The groups of leads from each one of these decoders is applied to gates such as 298, 300, 302 and 304. These gates are pulsed each "minor" cycle by the P-1 gate pulse. In this manner, pulses appear on cables such as 306, 308, 310 and 312 to enable gates such as 314, 316 through 318 and 320. An examination of the cables and the gates on FIG. 16B will indicate that data coming from any processor can be gated to itself or to any other processor by the P-1 gate pulse. It is believed that the operation of the inter-processor switch may now be understood by one skilled in the art and that no further explanation is needed for FIGS. 16A and 16B.

Figure 17A:
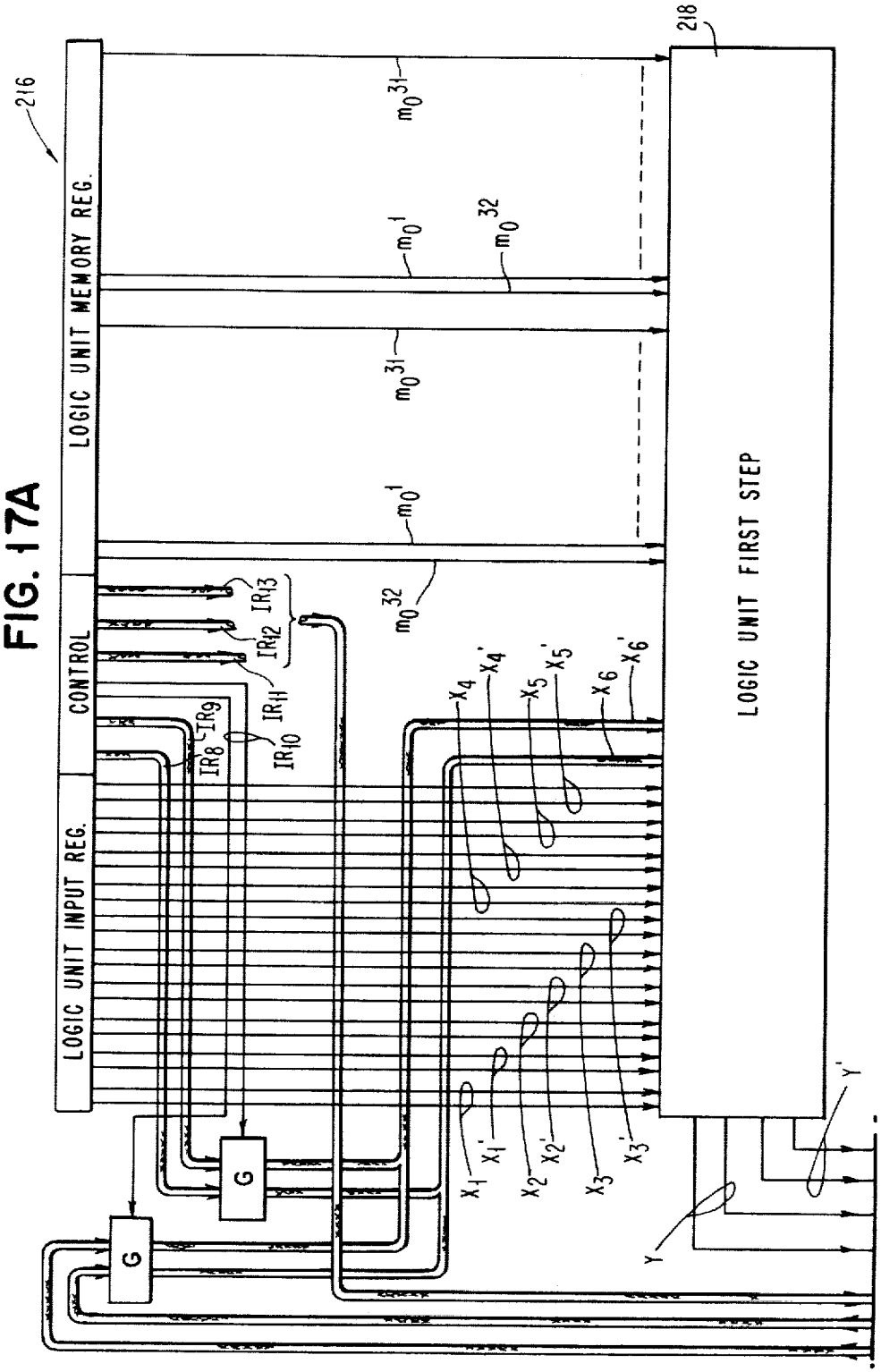

Reference should next be made to FIGS. 17A and 17B arranged as illustrated in FIG. 17. FIG. 17A shows how the information in the register 216, which is also shown on FIG. 13A, refers to the logic unit for step one and how the control bits are directed to gates which suitably control the logic. From FIG. 17A, the results of the logic unit first step are passed along with certain of the control bits in register 216 (FIG. 13A) to the logic unit second step shown in FIG. 17B. The boolean logic equations for the logic unit second step are shown in FIG. 17B and it is believed that there will be no difficulty in understanding the operation of this unit.

The "logic unit first step" shown in FIG. 17A carries out specific logic functions. The inputs to "logic unit first step" accepts $X_1, X_1', X_2, X_2', \ldots, X_6, X_6'$ and $m_0^0, m_0^1, m_0^2, \ldots, m_0^{31}$ and $m_1^0, m_1^1, m_1^2, \ldots m_1^{31}$ as shown in FIG. 17A. Using conventional logic circuits such as And gates, Or gates and inverters arranged in a manner well known to those skilled in the art, the following logic operations are performed by the logic unit first step.

$a = X_1 + X_1'$
$a' = \overline{X}_1 + X_1'$
$b = X_2 + X_2'$
$b' = \overline{X}_2 + X_2'$
$c = X_3 + X_3$
$c' = \overline{X}_3 + X_3'$
$d = X_4 + X_4$
$d' = \overline{X}_4 + X_4'$
$e = X_5 + X_5$
$e' = \overline{X}_5 + X_5'$ Using the $a, a', b, b' \ldots e'$ so produced then the logic performs the following operations:

$FP_{32} = a'b'c'd'e'$
$FP_1 = a'b'c'd'e'$
$FP_2 = a'b'c'd'e'$
$FP_3 = a'b'c'd'e'$
$FP_4 = a'b'c'd'e'$
$FP_5 = a'b'c'd'e'$
$FP_6 = a'b'c'd'e'$
$FP_7 = a'b'c'd'e'$
$FP_8 = a'b'c'd'e'$
$FP_9 = a'b'c'd'e'$
$FP_{10} = a'b'c'd'e'$
$FP_{11} = a'b'c'd'e'$
$FP_{12} = a'b'c'd'e'$
$FP_{13} = a'b'c'd'e'$
$FP_{14} = a'b'c'd'e'$
$FP_{15} = a'b'c'd'e'$
$FP_{16} = a'b'c'd'e'$
$FP_{17} = a'b'c'd'e'$
$FP_{18} = a'b'c'd'e'$
$FP_{19} = a'b'c'd'e'$
$FP_{20} = a'b'c'd'e'$
$FP_{21} = a'b'c'd'e'$
$FP_{22} = a'b'c'd'e'$
$FP_{23} = a'b'c'd'e'$
$FP_{24} = a'b'c'd'e'$
$FP_{25} = a'b'c'd'e'$
$FP_{26} = a'b'c'd'e'$
$FP_{27} = a'b'c'd'e'$
$FP_{28} = a'b'c'd'e'$
$FP_{29} = a'b'c'd'e'$
$FP_{30} = a'b'c'd'e'$
$FP_{31} = a'b'c'd'e'$

Using the FP values thus generated and the $m_0^{32}, m_0^0 \ldots, m_0^{31}$ inputs, the following steps are carried out:

$GB_{32} = (\overline{m}_0^{32})(FP_0)$
$GB_1 = (\overline{m}_0^1)(FP_1)$
$GB_2 = (\overline{m}_0^2)(FP_2)$
$GB_3 = (\overline{m}_0^3)(FP_3)$
$GB_4 = (\overline{M}_0^4)(FP_4)$
$GB_5 = (\overline{M}_0^5)(FP_5)$
$GB_6 = (\overline{M}_0^6)(FP_6)$
$GB_7 = (\overline{m}_0^7)(FP_7)$
$GB_8 = (\overline{m}_0^8)(FP_8)$
$GB_9 = (\overline{m}_0^9)(FP_9)$
$GB_{10} = (\overline{m}_0^{10})(FP_{10})$
$GB_{11} = (\overline{m}_0^{11})(FP_{11})$
$GB_{12} = (\overline{m}_0^{12})(FP_{12})$
$GB_{13} = (\overline{m}_0^{13})(FP_{13})$
$GB_{14} = (\overline{m}_0^{14})(FP_{14})$
$GB_{15} = (\overline{m}_0^{15})(FP_{15})$
$GB_{16} = (\overline{m}_0^{16})(FP_{16})$
$GB_{17} = (\overline{m}_0^{17})(FP_{17})$
$GB_{18} = (\overline{m}_0^{18})(FP_{18})$
$GB_{19} = (\overline{m}_0^{19})(FP_{19})$
$GB_{20} = (\overline{m}_0^{20})(FP_{20})$
$GB_{21} = (\overline{m}_0^{21})(FP_{21})$
$GB_{22} = (\overline{m}_0^{22})(FP_{22})$ $GB_{23} = (\overline{m}_0{}^{23})(FP_{23})$
$GB_{24} = (\overline{m}_0{}^{24})(FB_{24})$

| | | |
|---|---|---|
| $GB_{25} =$ | $(\overline{m}_0{}^{25})$ | $(FP_{25})$ |
| $GB_{26} =$ | $(\overline{m}_0{}^{26})$ | $(FP_{26})$ |
| $GB_{27} =$ | $(\overline{m}_0{}^{27})$ | $(FP_{27})$ |
| $GB_{28} =$ | $(\overline{m}_0{}^{28})$ | $(FP_{28})$ |
| $GB_{29} =$ | $(\overline{m}_0{}^{29})$ | $(FP_{29})$ |
| $GB_{30} =$ | $(\overline{m}_0{}^{30})$ | $(FP_{30})$ |
| $GB_{31} =$ | $(\overline{m}_0{}^{31})$ | $(FP_{31})$ |
| $GC_{32} =$ | $(m_0{}^{32})$ | $(FP_0)$ |
| $GC_1 =$ | $(m_0{}^1)$ | $(FP_1)$ |
| . | | |
| . | | |
| . | | |
| $GC_{30} =$ | $(m_0{}^{30})$ | $(FP_{30})$ |
| $GC_{31} =$ | $(m_0{}^{31})$ | $(FP_{31})$ |
| $GD_{32} =$ | $(\overline{m}_1{}^{32})$ | $(FP_0)$ |
| $GD_1 =$ | $(\overline{m}_1{}^1)$ | $(FP_1)$ |
| . | | |
| . | | |
| . | | |
| $GD_{30} =$ | $(\overline{m}_1{}^{30})$ | $(FP_{30})$ |
| $GD_{31} =$ | $(\overline{m}_1{}^{31})$ | $(FP_{31})$ |
| $GE_0 =$ | $(m_1{}^{32})$ | $(FP_0)$ |
| $GE_1 =$ | $(m_1{}^1)$ | $(FP_1)$ |
| . | | |
| . | | |
| . | | |
| $GE_{30} =$ | $(m_1{}^{30})$ | $(FP_{30})$ |
| $GE_{31} =$ | $(m_1{}^{31})$ | $(FP_{31})$ |

Figure 18:
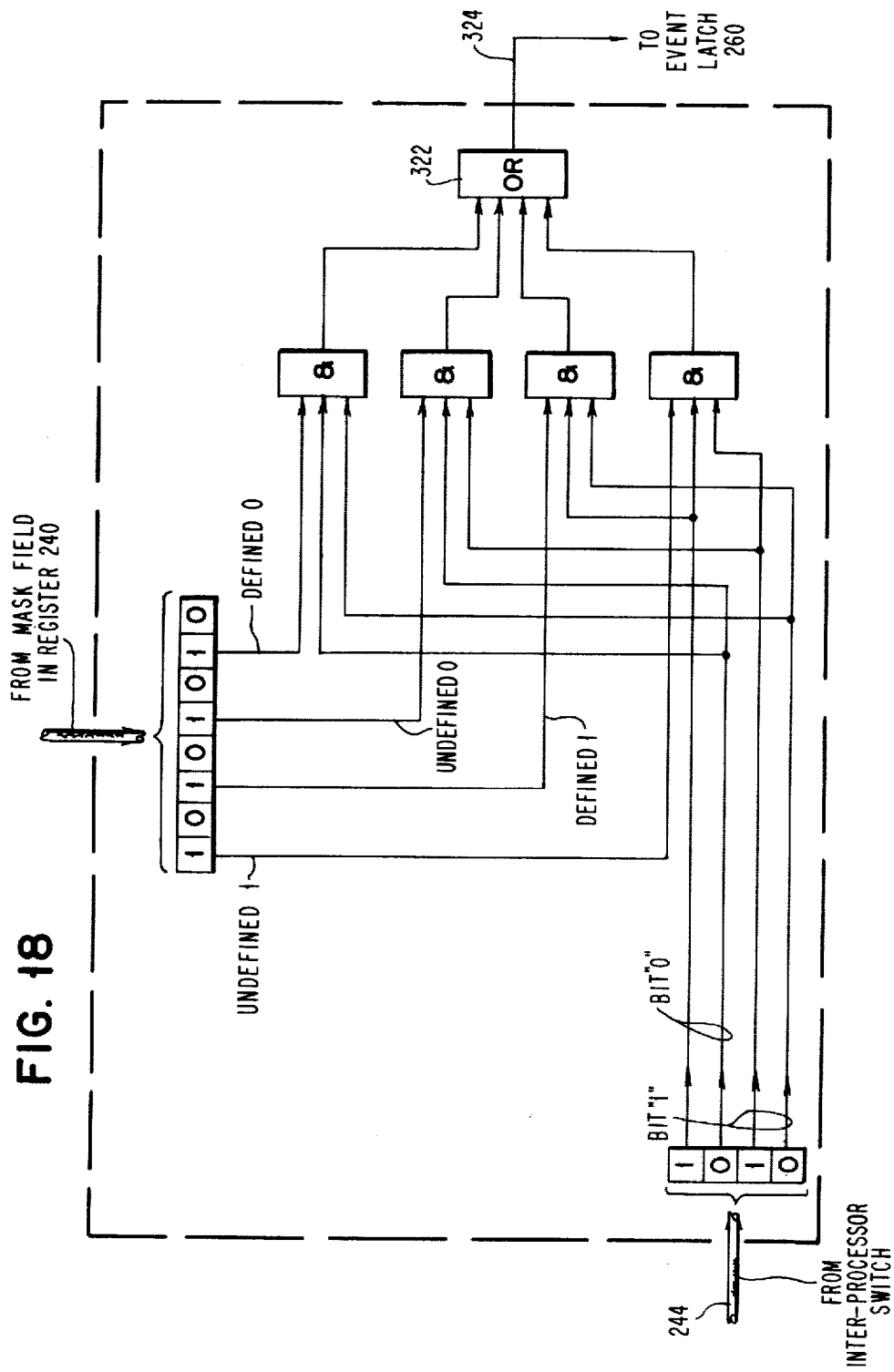
FIG. 18 illustrates a more detailed schematic drawing of the event logic structure of FIG. 13C.

And the, using the above values:
$GF = GB_{32} + GB_1 + \cdots + GB_{30} + GB_{31}$
$GG = GC_{32} + GC_1 + \cdots + GC_{30} + GC_{31}$
$GH = GD_{32} + GD_1 + \cdots + GD_{30} + GD_{31}$
$gI = GE_{32} + GE_1 + \cdots + GE_{30} + GE_{31}$ Finally, reference is made to FIG. 18 which shows the details of event logic of FIG. 13C. The event logic is shown on FIG. 13C with one of its inputs coming from the mask field in register 240 and its input from the cable 244 which comes from the inter-processor switch. As shown on FIG. 18, if the data from the mask field in register 240 combines with the data from the inter-processor switch to produce an output of the or circuit 322 which provides an output on line 324 in order to set the "event latch" 260 to its "1" state. Then, it is said that an "event" has occurred. As mentioned before, the detection of an "event" causes a signal to appear on lead wire 274 on FIG. 13D which signals the end of operations.

In other words, no more major cycles are needed. The results of the operations now exist in the A, B, A IN or B IN memories in processor numbers 1 through 31 and the A IN memory in processor 32 can be analyzed in any suitable manner. Such analyzing of this data in the machine to be built will be done by the host computer in conjunction with the lead computer which acts as an interface between the host computer and the logic simulation machine.

While the invention has been particularly shown and described with reference to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A highly parallel special purpose computing system for the simulation of computer logic operations comprising:

a plurality of basic processor means for executing logic simulation functions, each of said basic processor means including a first pair of memory units for storing a description of a plurality of logic functions to be simulated by said basic processor means, one of said first pair of memory units functioning as an instruction memory for storing and providing to a logic unit selected instruction functions for carrying out logic simulation functions, and the other of said first pair of memory units serves as a function memory for storing a plurality of separate selected logic functions to be executed in said logic simulation process in accordance with said instruction functions, second and third pairs of memory units for storing logic data value signals to be processed in accordance with said logic functions, said logic value signals including signals obtained from any of said other of said plurality of basic processor means, said second and third pairs of memory units functioning alternatively as a current signal value memory unit and current signal input memory unit pair for storing data values undergoing simulation and as a next signal value memory unit and next signal input memory unit pair for storing data values to be next simulated, a logic unit connected to said first, second and third pairs of memory units for obtaining logic functions from said first pair of memory units and for updating the data contents of at least one of said second and third pairs of memory units, inter-processor switching means connected to each of said plurality of basic processor means for transferring said logic value signals from any of said basic processor means to any other of said basic processor means, and a control processor means connected to said inter-processor switching means for providing control signals to each of said plurality of basic processor means, said control processor functioning to start and stop said basic processor means, to introduce instruction signals and data value signals into said basic processor means, and to transfer data value signals between said plurality of basic processor means.

2. A computing system according to claim 1 wherein each of said basic processor units further includes a switch select memory means for storing address information of each of said plurality of basic processor means and for entering updated logic value signals in said next signal value memory unit of said third pair of memory units of said basic processor.

3. A computing system according to claim 2 wherein said control processor includes at least six separate memory units connected to said inter-processor switch, said at least six memory units being respectively a switch select memory unit, an output signal memory unit, an input signal memory unit, an output permutation unit, an input permutation unit and an event mask memory unit, said switch select memory unit of said control processor functioning in accordance with said switch select memories of said basic control processor means, said output and input signal memories functioning to respectively receive and provide logic data value signals from and to said plurality of basic processor means via said inter-processor switch, said output and input permutation memories functioning to permute the order of said transfer of data value signals to and from said output and input signal memories, and said event mask memory unit stores event information which functions to halt the simulation processor of said computing system upon the occurrence of a simulation process event which is the same as said stored event information.

4. A computing system according to claim 3 wherein said simulation process of said system functions according to a major cycle sequence and a minor cycles sequence, said major cycle sequence including the steps wherein said basic processor logic unit sequences in order through said instruction memory of said first pair of memory units and executes each of said instructions on a logic simulation function from said function memory of said first pair of memory units on specificated data values from said current signal value memory of said second pair of memory units, said logic unit storing the results of said executions in said next signal value memory, each separate instruction execution performed by said logic unit being referred to as a minor cycle.

5. A computing system according to claim 4 wherein said logic functions specified in said function memory of said first pair of memory units include but are not limited to AND, OR, NAND, NOR and EXOR logic functions and wherein said logic unit in each said basic processors includes means for combining said logic functions to provide additional extended logic functions.

6. A computing system according to claim 5 wherein said computing system is adapted to be connected in combination with two general purpose computing systems, a host computer and a local computer, said host computer functioning to provide conventional support functions including but not limited to interface control, command parsing, display, code compiling and test sequences, said local computer functioning to provide machine execution control for said computing system including but not limited to single cycle execution communication with said host computer, simulation of large storage arrays, application of test sequences, and insertion and removal of logic faults for fault simulation operation.

* * * * *